US009842869B2

(12) United States Patent
Kimura

(10) Patent No.: US 9,842,869 B2
(45) Date of Patent: Dec. 12, 2017

(54) METHOD FOR MANUFACTURING SEMICONDUCTOR DEVICE AND SEMICONDUCTOR DEVICE

(71) Applicant: Renesas Electronics Corporation, Koutou-ku, Tokyo (JP)

(72) Inventor: Masatoshi Kimura, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/179,964

(22) Filed: Jun. 10, 2016

(65) Prior Publication Data
US 2017/0062500 A1    Mar. 2, 2017

(30) Foreign Application Priority Data

Aug. 27, 2015  (JP) ................................ 2015-167598

(51) Int. Cl.
*H01L 31/0352*    (2006.01)
*H01L 27/146*    (2006.01)

(52) U.S. Cl.
CPC .... *H01L 27/14605* (2013.01); *H01L 27/1463* (2013.01); *H01L 27/14621* (2013.01); *H01L 27/14627* (2013.01); *H01L 27/14645* (2013.01); *H01L 27/14687* (2013.01)

(58) Field of Classification Search
None
See application file for complete search history.

(56) References Cited

U.S. PATENT DOCUMENTS

| 5,283,460 | A | * | 2/1994 | Mita | ................... | H01L 27/1443 257/432 |
|---|---|---|---|---|---|---|
| 7,652,713 | B2 | | 1/2010 | Yamasaki | | |
| 2002/0121652 | A1 | * | 9/2002 | Yamasaki | ............... | G02B 7/34 257/222 |
| 2006/0076582 | A1 | * | 4/2006 | Nagasaki | .......... | H01L 21/76237 257/219 |
| 2006/0138580 | A1 | * | 6/2006 | Kim | ...................... | H01L 31/103 257/461 |
| 2006/0169978 | A1 | * | 8/2006 | Tatani | ............... | H01L 27/14643 257/53 |
| 2006/0219867 | A1 | * | 10/2006 | Yamaguchi | ....... | H01L 27/14689 250/208.1 |
| 2007/0045679 | A1 | * | 3/2007 | McKee | ............. | H01L 27/14603 257/291 |

(Continued)

FOREIGN PATENT DOCUMENTS

JP    2002-165126 A    6/2002

*Primary Examiner* — Sitaramarao S Yechuri
(74) *Attorney, Agent, or Firm* — Shapiro, Gabor and Rosenberger, PLLC

(57) ABSTRACT

In each pixel having a plurality of photodiodes for one microlens of a plurality of pixels arranged in a pixel array part, the photoelectrically converted electrons are prevented from moving between the photodiodes, thereby to improve the electron isolating characteristic, resulting in improved performances of a semiconductor device. In a well region immediately under between a first $N^-$ type semiconductor region forming a first photodiode in a pixel and a second $N^-$ type semiconductor region forming a second photodiode in the pixel, an isolation region higher in impurity density than the well region is formed.

17 Claims, 21 Drawing Sheets

(56) References Cited

U.S. PATENT DOCUMENTS

| | | | |
|---|---|---|---|
| 2008/0251822 A1* | 10/2008 | Yamaguchi | H01L 27/1463 257/292 |
| 2009/0045407 A1* | 2/2009 | Nagasaki | H01L 27/14603 257/72 |
| 2011/0031576 A1* | 2/2011 | Iwasa | H01L 21/26513 257/440 |
| 2014/0300786 A1* | 10/2014 | Okita | H01L 27/1461 348/294 |

* cited by examiner

METHOD FOR MANUFACTURING SEMICONDUCTOR DEVICE AND SEMICONDUCTOR DEVICE

CROSS-REFERENCE TO RELATED APPLICATIONS

The disclosure of Japanese Patent Application No. 2015-167598 filed on Aug. 27, 2015 including the specification, drawings and abstract is incorporated herein by reference in its entirety.

BACKGROUND

The present invention relates to a method for manufacturing a semiconductor device, and a semiconductor device. More particularly, the present invention relates to a technology effectively applicable to a semiconductor device including a solid-state image sensing element, and a manufacturing method thereof.

As is known, in a solid-state image sensing element (image element) for use in a digital camera equipped with an autofocusing system function, the solid-state image sensing element to which an imaging surface phase difference technology is applied, two or more photodiodes are provided in each of a plurality of pixels forming the image sensing element.

Patent Document 1 (Japanese Unexamined Patent Application Publication No. 2002-165126) describes the structure in which the sensitivity regions overlap each other in the region between two photodiodes provided in the pixel for the solid-state image sensing element using a phase difference detection system.

SUMMARY

The light incident from the left portion, and the light incident from the right portion of the microlens formed over one pixel are made incident upon two photodiodes included in the pixel, respectively. At this step, the light incident upon one photodiode generates electrons in the deeper region than the photodiode. The electrons may be accidentally accumulated in the other photodiode. In this case, false detection of the incident light is caused between the two photodiodes, unfavorably resulting in deterioration of the automatic detection precision of the focus.

Other objects and novel features will be apparent from the description of this specification and the accompanying drawings.

Summaries of the representative ones of the embodiments disclosed in the present application will be described in brief as follows.

A semiconductor device of one embodiment has an isolation region having a higher impurity density than that of a well region in the well region immediately under between a first N type semiconductor region forming a first photodiode in a pixel, and a second N type semiconductor region forming a second photodiode in the pixel.

Further, a method for manufacturing a semiconductor device of another embodiment includes: forming an isolation region having a higher impurity density than that of a well region in the well region immediately under between a first N type semiconductor region forming a first photodiode in a pixel, and a second N type semiconductor region forming a second photodiode in the pixel.

In accordance with one embodiment disclosed in the present application, the performances of a semiconductor device can be improved. Particularly, the focusing precision of the image sensing element can be enhanced.

DETAILED DESCRIPTION

Below, embodiments of the present invention will be described in details by reference to the accompanying drawings. Incidentally, in all the drawings for describing the embodiments, the members having the same function are given the same reference signs and numerals, and a repeated description thereon is omitted. Further, in the following embodiments, unless otherwise required, a description on the same or similar parts will not be repeated in principle.

Further, below, a description will be given to the case where the well region of the pixel is formed of a P type semiconductor region, and the photodiode is formed of an N type semiconductor region. However, the same effects are also produced when the well region and the photodiode have opposite conductivity types, respectively. Further, below, the element on which a light is made incident from the upper surface side of the solid-state image sensing element will be described as an example. However, also with a BSI (Back Side Illumination) type solid-state image sensing element, the same effects as those of the following embodiments can be produced when the same structure or process flow is used.

Whereas, the reference signs "−" and "+" each represent the relative density of the impurity of the conductivity type of n type or P type. For example, in the case of the N type impurity, the impurity density increases in the order of "N$^-$", "N", and "N$^+$".

Further, the term "height" used in the present application denotes the distance from the main surface of the semiconductor substrate. The term "depth" used in the present application denotes the distance from the main surface of the semiconductor substrate toward the bottom surface of the semiconductor substrate.

First Embodiment

Figure 1:
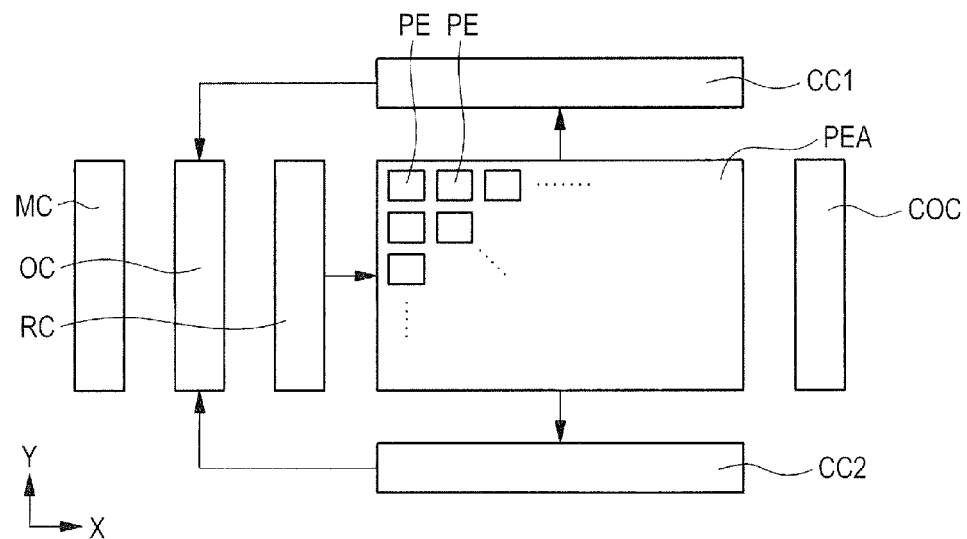
FIG. 1 is a schematic view showing a configuration of a semiconductor device of First Embodiment of the present invention.
Figure 2:
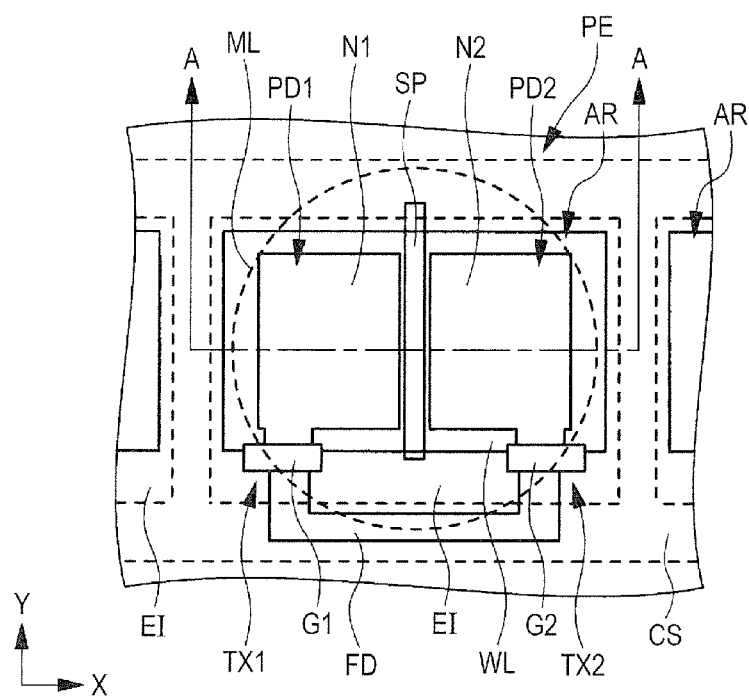
FIG. 2 is a plan view showing the pixel of the semiconductor device of First Embodiment of the present invention.
Figure 3:
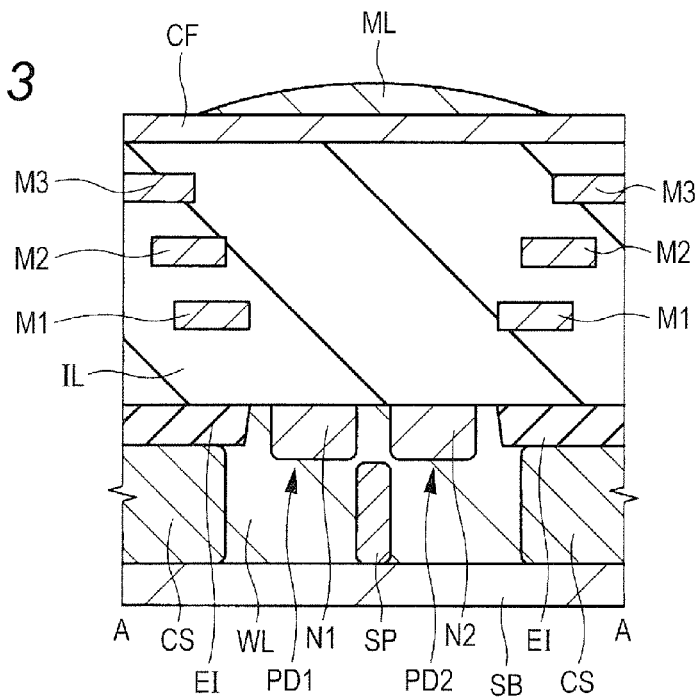
FIG. 3 is a cross sectional view showing the semiconductor device of First Embodiment of the present invention.
Figure 4:
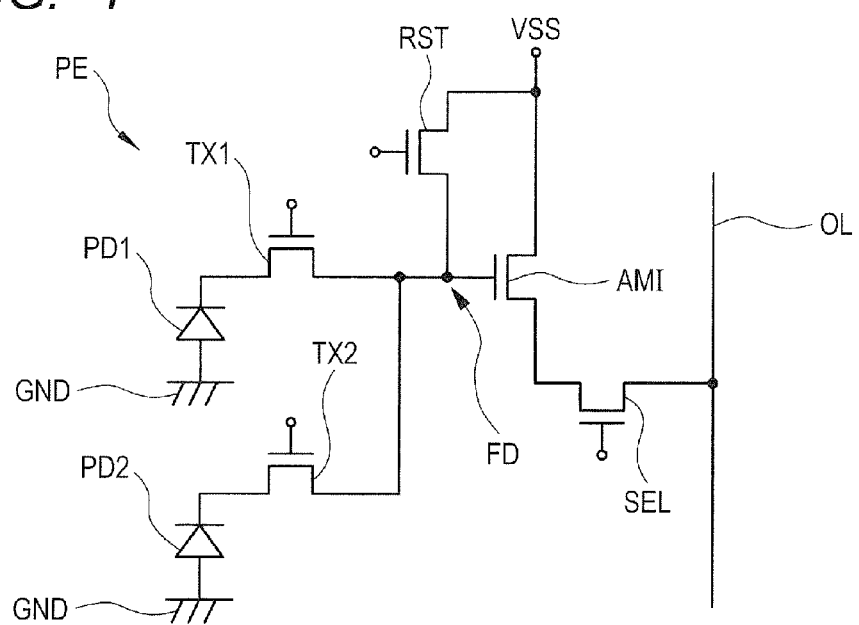
FIG. 4 is an equivalent circuit diagram showing the semiconductor device of First Embodiment of the present invention.
Figure 5:
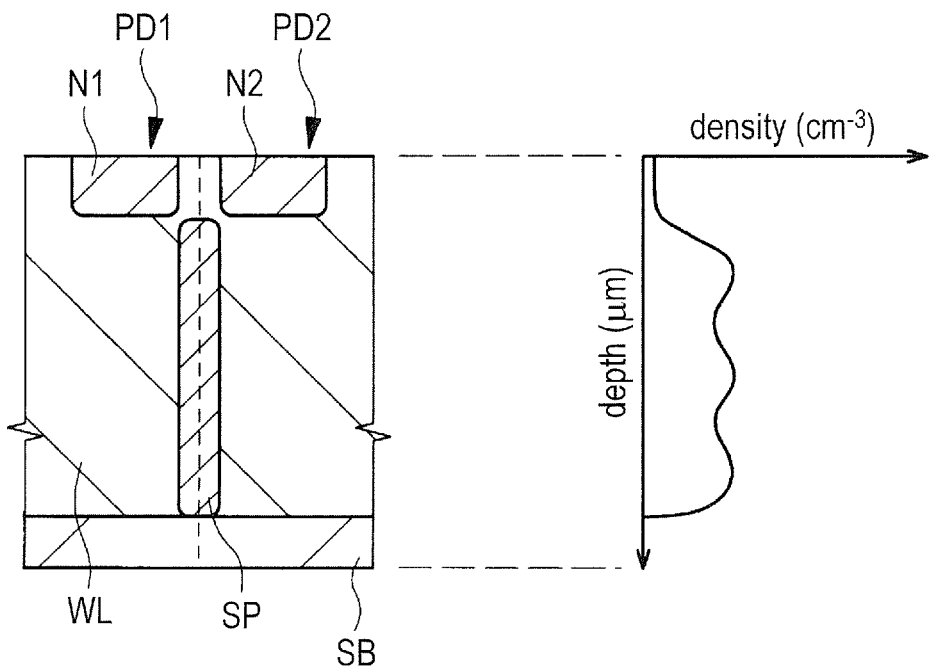
FIG. 5 is a view including a cross sectional view of the semiconductor device of First Embodiment of the present invention, and a graph indicating the density distribution of the semiconductor region.
Figure 6:
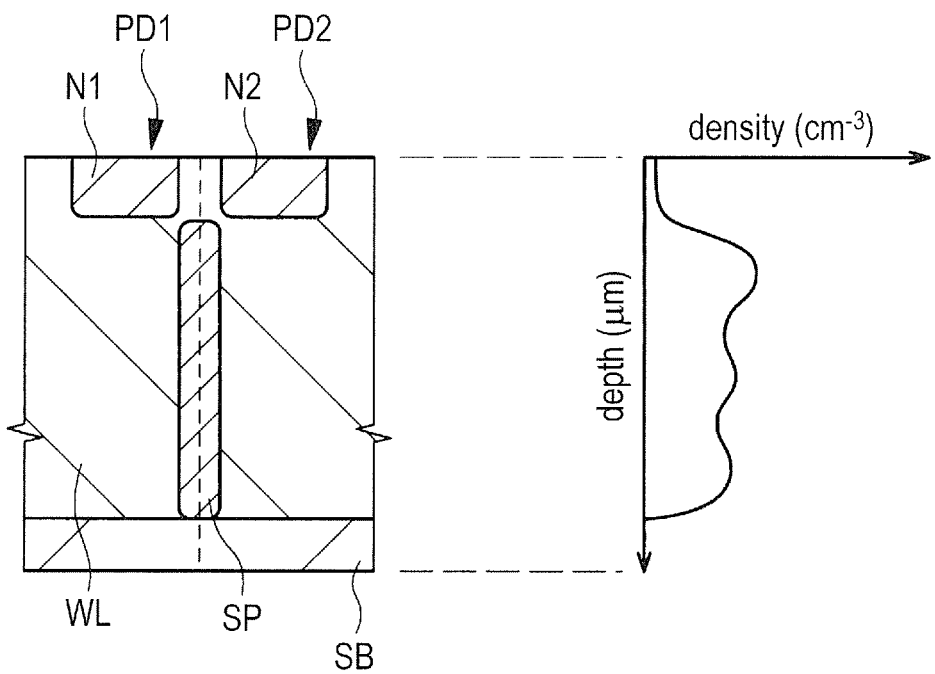
FIG. 6 is a view including a cross sectional view of the semiconductor device of First Embodiment of the present invention, and a graph indicating the density distribution of the semiconductor region.
Figure 7:
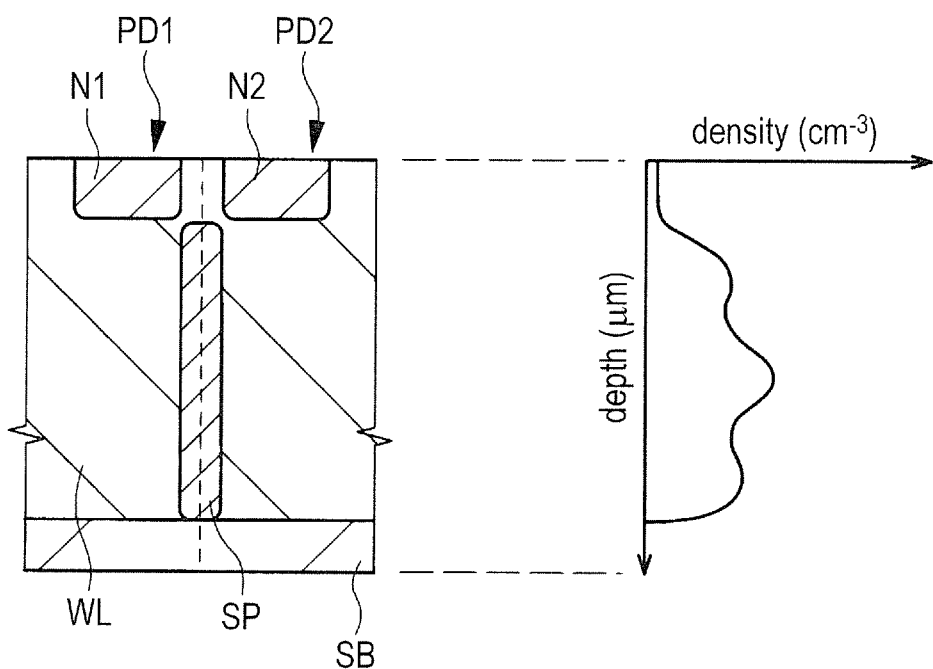
FIG. 7 is a view including a cross sectional view of the semiconductor device of First Embodiment of the present invention, and a graph indicating the density distribution of the semiconductor region.
Figure 34:
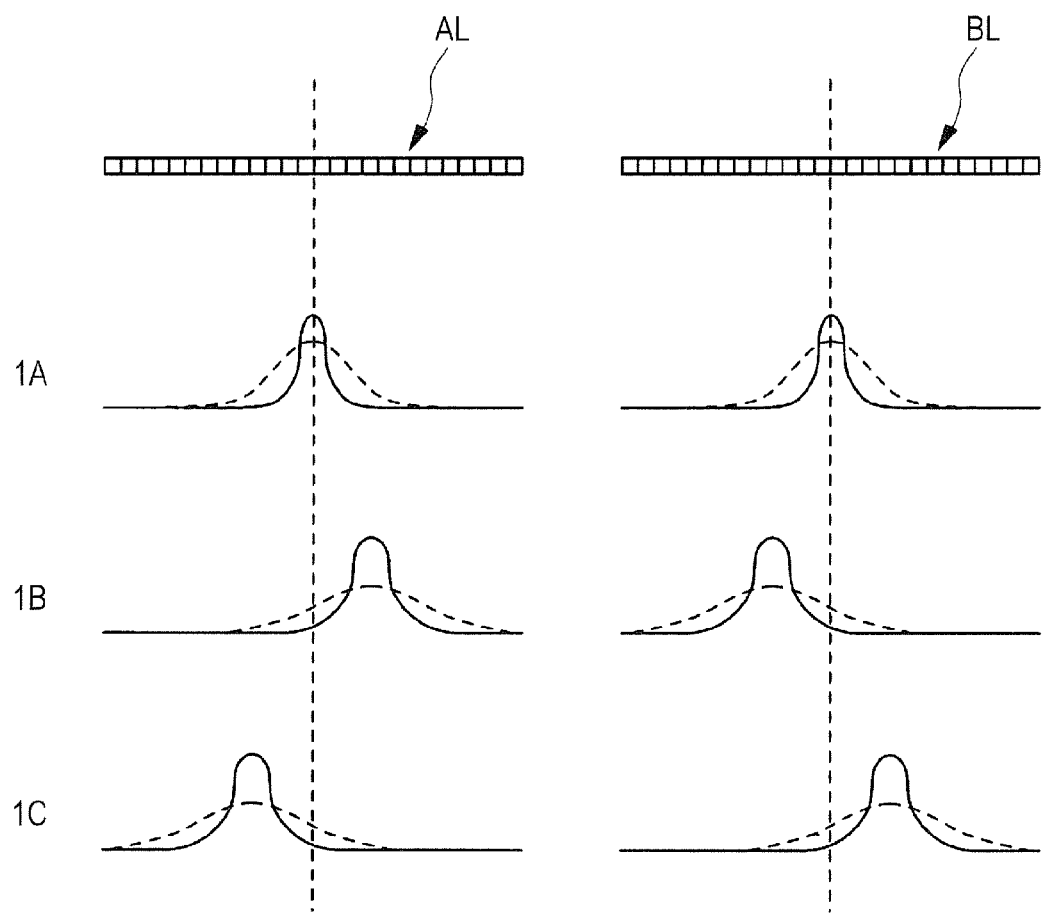
FIG. 34 is a view showing signals obtained by the operation of the semiconductor device for performing autofocusing of an imaging surface phase difference system.

A semiconductor device of the present embodiment relates to a solid-state image sensing element, and more particularly, relates to a solid-state image sensing element having a plurality of photodiodes in one pixel. The solid-state image sensing element is a CMOS (Complementary Metal Oxide Semiconductor) image sensor, and has a function of outputting information required for performing autofocusing by a focus detection method of an imaging surface phase difference system. Below, a description will be given to the formation of an isolation region for preventing electrons generated by photoelectric conversion in the substrate under the adjacent photodiodes in the pixel from moving between the two photodiodes. Regarding structure and functions of semiconductor device Below, by reference to FIGS. 1 to 3 and FIGS. 5 to 7, the structure of a semiconductor device of the present embodiment will be described. By reference to FIGS. 4 and 34, the functions of the semiconductor device of the present embodiment will be described. FIG. 1 is a schematic view showing a configuration of the semiconductor device of the present embodiment. FIG. 2 is a plan view showing one pixel included in the solid-state image sensing element of the semiconductor device of the present embodiment on an enlarged scale. FIG. 3 is a cross sectional view along line A-A of FIG. 2. FIG. 4 is an equivalent circuit diagram showing the semiconductor device of the present embodiment. FIGS. 5 to 7 are each a view including a cross sectional view of the semiconductor device of the present embodiment, and a graph showing the density distribution of the semiconductor region formed in the semiconductor device. FIG. 34 is a view showing signals obtained by the operation of the semiconductor device for performing autofocusing of an imaging surface phase difference system.

Further, herein, a description will be given assuming a four-transistor type pixel for use as a pixel realization circuit in a CMOS image sensor as one example of the pixel, which is not exclusive. Namely, in each pixel, three transistors of peripheral transistors, and transfer transistors are arranged around the light receiving region including two photodiodes. Herein, the peripheral transistors represent a reset transistor, an amplification transistor, and a selection transistor. In the following plan view, a description will be given by reference to a plan view in which some transistors (peripheral transistors) of each pixel are omitted, and only photodiodes, a floating diffusion capacitance part, and transfer transistors are shown.

A solid-state image sensing element of the semiconductor device of the present embodiment is a CMOS (Complementary Metal Oxide Semiconductor) image sensor, and has a pixel array part PEA, read circuits CC1 and CC2, an output circuit OC, a row selection circuit RC, a control circuit COC, and a memory circuit MC as shown in FIG. 1.

In the pixel array part PEA, a plurality of pixels PE are arranged in a matrix. In other words, at the upper surface of the semiconductor substrate forming the solid-state image sensing element, a plurality of pixels PE are arrayed in the X axis direction and the Y axis direction along the main surface of the semiconductor substrate. The X axis direction shown in FIG. 1 is the direction along the main surface of the semiconductor substrate forming the solid-state image sensing element, and the direction along the row direction in which the pixels PE are arrayed. Whereas, the Y axis direction which is the direction along the main surface of the semiconductor substrate, and orthogonal to the X axis direction is the direction along the column direction in which the pixels PE are arrayed. In other words, the pixels PE are aligned and arranged in a matrix.

Each of the plurality of pixels PE generates a signal corresponding to the intensity of the applied light. The row selection circuit RC selects the plurality of pixels PE on a row basis. The pixels PE selected by the row selection circuit RC respectively output the generated signals to an output line OL (see FIG. 4) described later. The read circuits CC1 and CC2 are arranged opposite to each other in the Y axis direction with the pixel array part PEA interposed therebetween. Each of the read circuits CC1 and CC2 reads the signal outputted from the pixel PE to the output line OL, and outputs the read signal to the output circuit OC. A memory circuit MC is a memory part for temporarily storing the signal outputted from the output line OL.

The read circuit CC1 reads the signals from the half pixels PE on the read circuit CC1 side of the plurality of pixels PE, and the read circuit CC2 reads the remaining half pixels PE on the read circuit CC2 side. The output circuit OC outputs the signals form the pixels PE read by the read circuits CC1 and CC2 to outside the present solid-state image sensing element. The control circuit COC integrally controls the operation of the overall solid-state image sensing element, and controls the operations of other constituent elements of the present solid-state image sensing element. The memory circuit MC stores the signal outputted from one of the two photodiodes in the pixel PE, and thereby is used for measuring the magnitude of the electric charge outputted from each of the two photodiodes.

FIG. 2 shows one pixel PE overlapping one microlens ML in a plan view of the pixel array part PEA (see FIG. 1). In other words, each pixel PE has one microlens ML. Herein, the outline of the microlens ML, and the outline of the pixel isolation region CS are each indicated with a broken line.

Most of the area of one pixel PE is occupied by the light receiving part including the photodiodes PD1 and PD2 formed at the upper surface of the semiconductor substrate SB (see FIG. 3). A plurality of peripheral transistors (not shown) are arranged around the light receiving part. The peripheral edge of each active region AR of the light receiving part and the peripheral transistors is surrounded by the element isolation region EI. The term "peripheral transistors" herein used represent the reset transistor RST, the amplification transistor AMI, and the selection transistor SEL shown in FIG. 4, respectively.

The active region AR of the light receiving part shown in FIG. 2 has a nearly rectangular shape in a plan view. In the active region AR, the photodiodes PD1 and PD2 are arranged side by side in the X axis direction which is the direction along the main surface of the semiconductor substrate. The photodiodes PD1 and PD2 are formed apart from each other. Both of the photodiodes PD1 and PD2 each have a rectangular shape in a plan view.

A floating diffusion capacitance part FD is a semiconductor region functioning as each drain region of the transfer transistor TX1 provided adjacent to the photodiode PD1, and the transfer transistor TX2 provided adjacent to the photodiode PD2, and is formed in the active region AR. The floating diffusion capacitance part FD is in an electrically floating state. For this reason, unless the reset transistor is operated, the electric charges accumulated in the floating diffusion capacitance part FD are held.

Each drain region of the transfer transistors TX1 and TX2 is an $N^+$ type semiconductor region formed at the main surface of the semiconductor substrate. The upper surface of the semiconductor region is coupled with a contact plug (not shown). Whereas, each upper surface of the gate electrodes G1 and G2 is also coupled with a contact plug (not shown).

The photodiode PD1 is formed of an $N^-$ type semiconductor region N1 formed at the main surface of the semiconductor substrate, and a well region WL of a P type semiconductor region. Similarly, the photodiode PD2 is formed of an $N^-$ type semiconductor region N2 formed at the main surface of the semiconductor substrate, and the well region WL. In other words, the $N^-$ type semiconductor region N1 forms the cathode of the photodiode PD1; the $N^-$ type semiconductor region N2 forms the cathode of the photodiode PD2; and the well region WL forms each anode of the photodiodes PD1 and PD2. Whereas, the $N^-$ type semiconductor region N1 forms the source region of the transfer transistor TX1, and the $N^-$ type semiconductor region N2 forms the source region of the transfer transistor TX2.

The photodiodes PD1 and PD2 of light receptive elements can be regarded as being formed in the $N^-$ type semiconductor regions N1 and N2, respectively. In the active region AR, a $P^-$ type well region WL is formed around each of the regions in which the $N^-$ type semiconductor regions N1 and N2 are formed, respectively.

The active region AR has a nearly rectangular shape in a plan view. Two projection parts are formed at one side of the four sides of the rectangle. The projection parts are coupled with each other at their extending tips. In other words, the active region AR has an annular plane layout formed of the projection parts and the rectangular pattern of the light receiving part. The element isolation region EI is formed inside the annular plane layout. In the projection parts, respective drain regions of the transfer transistors TX1 and TX2 are formed, respectively. In other words, the transfer transistors TX1 and TX2 have the floating diffusion capacitance part FD which is the drain region in common. Further, the gate electrodes G1 and G2 are arranged in such a manner as to extend over the two projection parts, respectively.

Incidentally, when a photographed image is outputted, the signals (electric charges) from the two photodiodes in the pixel are outputted together as one signal. As a result, it is possible to obtain an image with the image quality equivalent to that of a solid-state image sensing element including a plurality of pixels each having only one photodiode.

Over the semiconductor substrate, a lamination wiring layer including wires M1, M2, and M3 (see FIG. 3) is formed. Respective wires do not overlap the light receiving part including the photodiodes PD1 and PD2 in a plan view.

In the semiconductor substrate, and in the well region WL, an isolation region SP is formed in the region overlapping the region between the photodiodes PD1 and PD2 in a plan view. In other words, the isolation region SP is not formed at the main surface in the semiconductor substrate, and is formed in a deeper region than the main surface in the semiconductor substrate. The specific formation position of the isolation region SP will be described below by reference to FIG. 3.

The isolation region SP is the $P^+$ type semiconductor region formed by doping a P type impurity (e.g., B (boron)) into the semiconductor substrate by an ion implantation method, or the like. In other words, the P type impurity density of the isolation region SP is higher than the P type impurity density of the well region WL.

The isolation region SP extends in the Y axis direction which is the direction along the main surface in the semiconductor substrate, and is orthogonal to the X axis direction, and is formed from the end across to the other end in the Y axis direction of the active region AR including the photodiodes PD1 and PD2 in a plan view. Further, the isolation region SP is formed in such a manner as to overlap the element isolation region EI adjacent to the end of the active region AR in the Y axis direction in a plan view. Namely, the end of the isolation region SP is formed at the deeper position than that of the element isolation region EI in the semiconductor substrate.

Whereas, a pixel isolation region CS for isolating respective pixels PE is formed immediately under the element isolation region EI around the active region AR. The pixel isolation region CS is a P+ type semiconductor region formed by doping a P type impurity (e.g., B (boron)) into the semiconductor substrate by an ion implantation method, or the like. The pixel isolation region CS is formed between respective pixels PE, and has a role of preventing electrons from moving between the pixels in the semiconductor substrate. Herein, the pixel isolation region CS partially overlaps the pixel isolation region CS in a plan view.

FIG. 3 shows a cross sectional view along the direction in which the photodiodes PD1 and PD2 in one pixel PE (see FIG. 2) are aligned. In the cross sectional view shown in FIG. 3, the boundaries between a plurality of interlayer insulation films stacked over the semiconductor substrate SB are not shown. A P− type well region WL is formed in the upper surface of the semiconductor substrate SB formed of an N type single crystal silicon, or the like. The element isolation regions EI for dividing an active region from other active regions are formed over the well region WL. The element isolation region EI is formed of, for example, a silicon oxide film, and is embedded in the trench formed in the upper surface of the semiconductor substrate SB. In other words, the element isolation region EI is in contact with the surface of the semiconductor substrate SB.

In the upper surface of the well region WL, the N− type semiconductor regions N1 and N2 are formed apart from each other. The well region WL forming a PN junction with the N− type semiconductor region N1 functions as the anode of the photodiode PD1. The well region WL forming a PN junction with the N− type semiconductor region N2 functions as the anode of the photodiode PD2. The N− type semiconductor region N1 and the N− type semiconductor region N2 are provided in one active region interposed between the element isolation regions EI. The N− type semiconductor regions N1 and N2 are deeper in formation depth than the element isolation regions EI.

Thus, in the active region formed in the pixel, the photodiode PD1 formed of the N− type semiconductor region N1 and the well region WL, and the photodiode PD2 formed of the N− type semiconductor region N2 and the well region WL are formed. In the active region, the photodiodes PD1 and PD2 are aligned and arranged in the upper surface of the semiconductor substrate SB in such a manner as to interpose the region in which the well region WL is exposed. In other words, in the semiconductor substrate SB, the well region WL is formed, and the isolation region SP is not formed between the N− type semiconductor region N1 and the N− type semiconductor region N2.

An isolation region SP is formed immediately under the region between the N− type semiconductor region N1 and the N− type semiconductor region N2. The isolation region SP is formed from the height (depth) of each bottom surface of the N− type semiconductor region N1 and the N− type semiconductor region N2 across to the depth of the bottom surface of the well region WL, and is not formed immediately under the N− type semiconductor region N1 and the N− type semiconductor region N2. In other words, the isolation region SP is formed between the well region WL immediately under the N− type semiconductor region N1 and the well region WL immediately under the N− type semiconductor region N2. The bottom of the isolation region SP reaches the depth of the boundary between the well region WL and the portion of the semiconductor substrate SP in which the well region WL is not formed.

The isolation region SP is a semiconductor region provided for preventing the electrons generated by photoelectric conversion when a light is made incident upon the inside of the well region WL at a position deeper than the N− type semiconductor region N1 and the N− type semiconductor region N2 from moving not to the nearest N− type semiconductor region but to the other N− type semiconductor region, to be accumulated therein. For this reason, the isolation region SP is formed in such a manner as to separate the well region WL immediately under the N− type semiconductor region N1 from the well region WL immediately under the N− type semiconductor region N2.

Herein, when the width of the isolation region SP with a high P type impurity density in the Y axis direction (see FIG. 2) is large, the electrons generated by photoelectric conversion in the isolation region SP pair-annihilate with the holes in the isolation region SP, unfavorably resulting in the degradation of the sensitivity of the pixel. Further, even when the width of the isolation region SP is small, the isolation region SP can carry out a role of preventing the movement of the electrons. Therefore, the width of the isolation region SP in the Y axis direction is desirably minimized. Accordingly, the width of the isolation region SP is the minimum dimension formable in the manufacturing step.

A pixel isolation region CS is formed immediately under the element isolation region EI. The pixel isolation region CS is formed from the lower surface of the element isolation region EI across to the bottom surface of the well region WL in the well region WL. The formation of the pixel isolation region CS can prevent the electrons generated in the well region WL from moving to other pixels.

Over the semiconductor substrate SB, an interlayer insulation film IL is formed in such a manner as to cover the element isolation regions EI, and the photodiodes PD1 and PD2. The interlayer insulation film IL is a lamination film of a plurality of insulation films stacked one over another. In the interlayer insulation film IL, a plurality of wiring layers are stacked. A wire M1 covered with the interlayer insulation film IL is formed at the lowermost wiring layer. Over the wire M1, a wire M2 is formed via the interlayer insulation film IL. Over the wire M2, a wire M3 is formed via the interlayer insulation film IL. A color filter CF is formed at the top of the interlayer insulation film IL. A microlens ML is formed over the color filter CF. During the operation of the solid-state image sensing element, a light is applied to the photodiodes PD1 and PD2 via the microlens ML and the color filter CF.

A wire is not formed immediately over the active region including the photodiodes PD1 and PD2. This is for preventing the following: the light incident through the microlens ML is blocked by the wire, and is prevented from being applied to the photodiodes PD1 and PD2 of the light receiving parts of the pixel. Conversely, the wires M1 to M3 are arranged in other regions than the active region. This prevents the occurrence of photoelectric conversion in the active region including the peripheral transistors, and the like formed therein.

Incidentally, in the present embodiment, a description is given to the case where, as the photodiode, the P type well region WL serves as the anode, and the diffusion layer of the N− type semiconductor region N1 or N2 serves as the cathode. However, not limited to this, the same effects can also be produced with a solid-state image sensing element having a photodiodes each formed of an N type well, and a P⁻ type diffusion layer in the N type well, or at the surfaces thereof, a photodiode including a diffusion layer of the same conductivity type as that of the pixel well present at the surface.

Below, the structure and the operation of the solid-state image sensing element will be described mainly by reference to FIGS. 4 and 34.

FIG. 4 shows the equivalent circuit of one pixel. Each of the plurality of pixels PE shown in FIG. 1 has the circuit shown in FIG. 4. As shown in FIG. 4, the pixel has photodiodes PD1 and PD2 for performing photoelectric conversion, a transfer transistor TX1 for transferring electric charges generated in the photodiode PD1, and a transfer transistor TX2 for transferring electric charges generated in the photodiode PD2. Whereas, the pixel has a floating diffusion capacitance part FD for accumulating the electric charges transferred from the transfer transistors TX1 and TX2, and an amplification transistor AMI for amplifying the electric potential of the floating diffusion capacitance part FD. The pixel further includes a selection transistor SEL for selecting whether the electric potential amplified at the amplification transistor AMI is outputted to the output line OL coupled with one of the read circuits CC1 and CC2 (see FIG. 1), or not, and a reset transistor RST for initializing each electric potential of the cathodes of the photodiodes PD1 and PD2, and the floating diffusion capacitance part FD to a prescribed electric potential. The transfer transistors TX1 and TX2, the reset transistor RST, the amplification transistor AMI, and the selection transistor SEL are each, for example, an N type MOS transistor.

Respective anodes of the photodiodes PD1 and PD2 are applied with a ground potential GND of a minus-side power supply potential. Respective cathodes of the photodiodes PD1 and PD2 are coupled with the sources of the transfer transistors TX1 and TX2, respectively. The floating diffusion capacitance part FD is coupled with respective drains of the transfer transistors TX1 and TX2, the source of the reset transistor RST, and the gate of the amplification transistor AMI. The drain of the reset transistor RST, and the drain of the amplification transistor AMI are applied with a plus-side power supply potential VCC. The source of the amplification transistor AMI is coupled with the drain of the selection transistor SEL. The source of the selection transistor SEL is coupled with the output line OL coupled with any one of the read circuits CC1 and CC2.

Then, the operation of the pixel will be described. First, the gate electrodes of the transfer transistors TX1 and TX2 and the reset transistor RST are each applied with a prescribed potential. As a result, the transfer transistors TX1 and TX2, and the reset transistor RST are all rendered in the ON state. Then, the electric charges remaining in the photodiodes PD1 and PD2, and the electric charges accumulated in the floating diffusion capacitance part FD flow toward the plus-side power supply potential VCC. As a result, the electric charges in the photodiodes PD1 and PD2, and the floating diffusion capacitance part FD are initialized. Then, the reset transistor RST is rendered in the OFF state.

Then, the incident light is applied to the PN junctions of the photodiodes PD1 and PD2, so that photoelectric conversion is caused at the photodiodes PD1 and PD2. As a result, electric charges are generated at each of the photodiodes PD1 and PD2. The electric charges are all transferred to the floating diffusion capacitance part FD by the transfer transistors TX1 and TX2. The floating diffusion capacitance part FD accumulates the transferred electric charges. This results in a change in electric potential of the floating diffusion capacitance part FD.

Then, when the selection transistor SEL is rendered in the ON state, the electric potential of the floating diffusion capacitance part FD after change is amplified by the amplification transistor AMI, and then, is outputted to the output line OL. Then, one of the read circuits CC1 and CC2 reads the electric potential of the output line OL. Incidentally, for performing autofocusing of an imaging surface phase difference system, respective electric charges in the photodiodes PD1 and PD2 are not simultaneously transferred to the floating diffusion capacitance part FD by the transfer transistors TX1 and TX2, respectively, but respective electric charges are sequentially transferred and read, thereby to read respective values of electric charges of the photodiodes PD1 and PD2, respectively. For performing image sensing, respective electric charges in the photodiodes PD1 and PD2 are simultaneously transferred to the floating diffusion capacitance part FD.

Then, the operations of the solid-state image sensing element which is the semiconductor device of the present embodiment will be described more specifically. As the operations of the solid-state image sensing element, mention may be made of the image sensing operation and the autofocusing operation.

First, a description will be given to the operation of the pixel when image sensing is performed. In this case, first, the gate electrodes of the transfer transistors TX1 and TX2, and the reset transistor RST are each applied with a prescribed electric potential. As a result, the transfer transistors TX1 and TX2, and the reset transistor RST are rendered in the ON state. Then, the electric charges remaining in the photodiodes PD1 and PD2, and the electric charges accumulated in the floating diffusion capacitance part FD flow toward the plus-side power supply potential VCC. As a result, the electric charges in the photodiodes PD1 and PD2, and the floating diffusion capacitance part FD are initialized. Then, the reset transistor RST is rendered in the OFF state.

Then, the incident light is applied to the PN junctions of the photodiodes PD1 and PD2, so that photoelectric conversion is caused at each of the photodiodes PD1 and PD2. As a result, an electric charge L1 is generated in the photodiode PD1, and an electric charge R1 is generated in the photodiode PD2. Thus, the photodiodes PD1 and PD2 are each a light receiving element, namely, a photoelectric conversion element for generating a signal electric charge corresponding to the light amount of the incident light in the inside thereof by photoelectric conversion.

Then, the electric charges are transferred to the floating diffusion capacitance part FD. In the image sensing operation, the two photodiodes PD1 and PD2 in the pixel PE are regarded as one photoelectric conversion part to be operated. For this reason, respective electric charges in the photodiodes PD1 and PD2 are synthesized and read as one signal. Namely, in the image sensing operation, the electric charge signals respectively generated at the two photodiodes PD1 and PD2 are added, thereby to be acquired as one pixel information.

Therefore, it is not necessary to separately read the electric charges in the photodiodes PD1 and PD2. At this step, the transfer transistors TX1 and TX2 are turned ON, thereby to transfer the electric charges to the floating diffusion capacitance part FD. As a result, the floating diffusion capacitance part FD accumulates the electric charges transferred from the photodiodes PD1 and PD2. This results in a change in electric potential of the floating diffusion capacitance part FD.

Herein, the process of the synthesis of the electric charges will be specifically described. Herein, first, with the electric charge L1 in the photodiode PD1, and the electric charge R1 in the photodiode PD2 accumulated, the gate electrodes G1 and G2 are applied with a voltage, so that the transfer transistors TX1 and TX2 are rendered in the ON state. As a result, the electric charges L1 and R1 are transferred to the floating diffusion capacitance part FD for synthesis.

Then, the selection transistor SEL is rendered in the ON state, so that the electric potential of the floating diffusion capacitance part FD after change is amplified by the amplification transistor AMI. As a result, the electric signal in response to the variation in electric potential of the floating diffusion capacitance part FD is outputted to the output line OL. In other words, the selection transistor SEL is operated, thereby to output the electric signal outputted by the amplification transistor AMI to the outside. As a result, one of the read circuits CC1 and CC2 (see FIG. 1) reads the electric potential of the output line OL.

Subsequently, a description will be given to the operation of the pixel for performing autofocusing of an imaging surface phase difference system. In the solid-state image sensing element which is the semiconductor device of the present embodiment, a plurality of photoelectric conversion parts (e.g., photodiodes) are provided in one pixel. Thus, a plurality of photodiodes are provided in a pixel. This is for the following reason: for example, when the solid-state image sensing element is used for a digital camera having an imaging surface phase difference type automatic focus detection system, the precision and the speed of autofocusing can be improved.

With such a digital camera, the driving amount (moving amount) of the focus lens necessary for focusing is calculated from the shift amount, namely, the phase difference between the signals respectively detected by one photodiode and the other photodiode in the pixel. As a result, focusing for a short time can be implemented. Accordingly, by providing a plurality of photodiodes in the pixel, it is possible to form a larger number of minute photodiodes in the solid-state image sensing element. For this reason, the precision of autofocusing can be improved. Therefore, for performing autofocusing, as distinct from the image sensing operation, it is necessary to separately read the electric charges respectively generated in the plurality of photodiodes in the pixel.

In the operation of automatic focus detection, first, the gate electrodes of the transfer transistors TX1 and TX2, and the reset transistor RST are each applied with a prescribed electric potential. As a result, the transfer transistors TX1 and TX2, and the reset transistor RST are all rendered in the ON state. This results in initialization of the electric charges in the photodiodes PD1 and PD2, and the floating diffusion capacitance part FD. Then, the reset transistor RST is rendered in the OFF state.

Then, the incident light is applied to the PN junctions of the photodiodes PD1 and PD2, so that photoelectric conversion occurs at each of the photodiodes PD1 and PD2. As a result, electric charges are generated at the photodiodes PD1 and PD2, respectively. Herein, the electric charge generated in the photodiode PD1 is assumed to be referred to as L1; and the electric charge generated in the photodiode PD2, as R1.

Then, one of the electric charges is transferred to the floating diffusion capacitance part FD. Herein, first, the transfer transistor TX1 is turned ON, so that the electric charge L1 in the photodiode PD1 is read to the floating diffusion capacitance part FD, resulting in a change in electric potential of the floating diffusion capacitance part FD. Then, the selection transistor SEL is rendered in the ON state. Thus, the electric potential of the floating diffusion capacitance part FD after change is amplified by the amplification transistor AMI, and then, is outputted to the output line OL. In other words, the electric signal in response to the variation in electric potential of the floating diffusion capacitance part FD of an electric charge detection part is amplified by the amplification transistor AMI, to be outputted. As a result, one of the read circuits CC1 and CC2 (see FIG. 1) reads the electric potential of the output line OL. The signal including the resulting electric charge L1 thus read is stored by the memory circuit MC (see FIG. 1).

At this step, in the floating diffusion capacitance part FD, the electric charge L1 generated in the photodiode PD1 remains, so that the electric potential of the floating diffusion capacitance part FD has remained changed. Whereas, the electric charge R1 in the photodiode PD2 has not yet been transferred.

Then, the transfer transistor TX2 is turned ON, so that the electric charge R1 in the photodiode PD2 is read to the floating diffusion capacitance part FD. As a result, the electric potential of the floating diffusion capacitance part FD is further changed.

As a result, in the floating diffusion capacitance part FD, the electric charge obtained by synthesizing the originally accumulated electric charge L1 in the photodiode PD1, and the subsequently transferred electric charge R1 in the photodiode PD2 is accumulated. In other words, the electric charge of L1+R1 is accumulated in the floating diffusion capacitance part FD.

Then, the selection transistor SEL is rendered in the ON state, so that the electric potential of the floating diffusion capacitance part FD after change is amplified by the amplification transistor AMI, and then, is outputted to the output line OL. As a result, one of the read circuits CC1 and CC2 (see FIG. 1) reads the electric potential of the output line OL. In order to calculate the electric charge R1 generated in the photodiode PD2 from the thus read electric charge L1+R1, the following calculation is performed. Namely, the value of the electric charge L1 stored in the memory circuit MC (see FIG. 1) is subtracted from the value of the electric charge L1+R1. As a result, the electric charge R1 in the photodiode PD2 can be read. Such an operation is performed at, for example, the control circuit COC (see FIG. 1).

Then, from the shift amount, namely, the phase difference between the electric charges L1 and R1 detected by the photodiodes PD1 and PD2, respectively, in each pixel of the pixel array part PEA (see FIG. 1), the driving amount (moving amount) of the focus lens necessary for focusing is calculated, thereby to perform detection of the autofocusing point.

Incidentally, when respective electric charges in the photodiodes PD1 and PD2 are sequentially read as described above, the object to be read first may be the electric charge R1 in the photodiode PD2, followed by reading of the electric charge L1 in the photodiode PD1.

Alternatively, as another operation for automatic focusing, the following method can also be considered: the operation of calculating the electric charge R1 from the synthesized electric charge L1+R1 is omitted. In other words, first, the transfer transistor TX1 is turned ON, so that the electric charge L1 is read and stored. Then, the reset transistor RST is turned ON, so that the floating diffusion capacitance part FD is reset. Thus, subsequently, the transfer transistor TX2 is turned ON. As a result, the electric charge R1 in the photodiode PD2 can be read alone. Also in this case, the electric charge L1 is required to be stored in the memory circuit MC (see FIG. 1). However, even when the calculation as described above is not performed, the electric charge L1 and the electric charge R1 can be read alone, respectively.

When the solid-state image sensing element of the present embodiment is used for a digital camera, the image sensing operation is performed in each pixel in image sensing of both of a static image and a moving image. Further, in image sensing of a moving image, the autofocusing operation is performed with image sensing at each pixel. In image sensing of a static image, there are the case where the autofocusing operation is performed at each pixel, thereby to perform focusing; and the case where the autofocusing operation is not performed at a pixel, but an autofocusing device other than the solid-state image sensing element is used. In order to image-sense a high-quality moving image, it is important to implement automatic focus detection at a high speed and with precision.

Then, by reference to FIG. 34, a description will be given to the distribution of signals obtained in the pixel array part PEA (see FIG. 1) in focus detection. With the solid-state image sensing element of the present embodiment, by the two photodiodes included in each pixel, a pair of subject images (which will be hereinafter also referred to as dual images) formed by a pair of luminous fluxes from mutually different pupil regions are photoelectrically converted, resulting in a pair of image signals.

Each line of the pixel array part PEA (see FIG. 1) can be regarded as including two photodiode arrays for photoelectrically converting the dual images, respectively. In the following description, for focus detection, an individual photodiode is treated as a pixel, and the two photodiode arrays are referred to as A-line pixels AL and B-line pixels BL. Namely, the A line is a pixel line formed of only a plurality of photodiodes PD1 (see FIG. 2) in one line of pixels aligned in the Y axis direction of the pixel array part PEA of FIG. 1. Whereas, the B line is a pixel line formed of only a plurality of photodiodes PD2 (see FIG. 2) in the one line of pixels.

FIG. 34 shows, on the left side, the A-line pixels AL included in one pixel line, and thereunder, image signals in the focusing state 1A, the front pin state 1B, and the rear pin state 1C. Similarly, FIG. 34 shows, on the right side, the B-line pixels BL included in the one pixel line, and thereunder, image signals in the focusing state 1A, the front pin state 1B, and the rear pin state 1C. The A-line pixel AL and the B-line pixel BL can provide respective pairs of image signals in the focusing state 1A, the front pin state 1B, and the rear pin state 1C. Incidentally, the front pin state used in the present application denotes the state in which the focus is shifted to the front of the subject. Whereas, the rear pin state denotes the state in which the focus is shifted to behind the subject.

The image signals shown on the left side of FIG. 34 is the signal obtained by outputting the electric charge accumulated in the photodiode PD1 (see FIG. 4) to the output line OL (FIG. 4). Whereas, the signal shown on the right side of FIG. 34 is the signal obtained by outputting the electric charge accumulated in the photodiode PD2 (see FIG. 4) to the output line OL (FIG. 4). In the graph showing each image signal, the vertical axis indicates the magnitude of the electric charge, and the horizontal axis indicates the position of the corresponding pixel line. In other words, the region from one end to the other end of the horizontal axis corresponds to the region from an end to another end of the pixel line including the A-line pixel AL or the B-line pixel BL. Incidentally, herein, each image signal indicated with a solid line in FIG. 34 will be described. The signal indicated with each broken line in FIG. 34 will be used in the later description.

The spacing between a pair of image signals formed by outputs from the A-line pixel AL and the B-line pixel BL varies according to the focus state of the photographing optical system (the focusing state, the front pin state, and the rear pin state). Then, when the photographing optical system is in the front pin state or the rear pin state, the focus lens included in the photographing optical system is moved so that the spacing between the pair of image signals matches the spacing in the focusing state. In other words, the moving amount of the focus lens can be determined by calculation from the relative shift amount of the dual images corresponding to the defocusing amount of the photographing optical system.

In the focusing operation using the imaging surface phase difference system, focusing is achieved by thus obtaining a pair of image signals. To that end, the moving amount of the focus lens is calculated, thereby to perform autofocusing for a short time with precision. In the focusing state, the outputs from the A-line pixel AL and the B-line pixel BL are the same. In other words, in the focusing state, in each of the two photodiodes included in a pixel, the image sensing outputs obtained from one subject become equal. From the viewpoint of exactly detecting the focus state, desirably, the image signals obtainable in the focusing state, the front pin state, and the rear pin state are not gentle throughout each pixel line, and the signal at one part is particularly large and steep.

Then, the density distribution of the P type impurity in the isolation region SP will be described by reference to FIGS. 5 to 7. FIGS. 5 to 7 show, on the left side of each drawing, the cross section of the semiconductor substrate SB including the photodiodes PD1 and PD2, and show, on the right side of each drawing, the density of the P type impurity in the semiconductor substrate SB by a graph. The graph shows the density of the P type impurity at the position indicated with a broken line in the cross sectional view of the semiconductor substrate SB, in other words, in the region from the main surface across to the back surface of the semiconductor substrate SP including the midpoint between the photodiodes PD1 and PD2. The horizontal axis of the graph indicates the density of the P type impurity, and the vertical axis indicates the depth from the main surface of the semiconductor substrate SB.

As shown in FIGS. 5 to 7, the distribution of the P type impurity density is not constant, and a plurality of high-density parts are present between the main surface and the back surface of the semiconductor substrate SB. This is due to the fact that the isolation region SP is formed using a multi-stage implantation method in which ion implantation is performed a plurality of times by changing the conditions for ion implantation. Incidentally, herein, a high-density part is referred to as a density peak. The density peak denotes the part with a higher impurity density than those of the adjacent regions in the depth direction of the semiconductor substrate SB. In other words, the impurity density of the region between the two density peaks adjacent to each other in the depth direction is lower than the impurity density in the two density peaks.

In the present embodiment, the isolation region SP formed by multi-stage implantation of three times is shown as an example. Accordingly, three density peaks are present side by side in the depth direction of the semiconductor substrate SB. In other words, the isolation region SP has a plurality of density peaks at different depths. In other words, with the multi-stage implantation step, a plurality of times of ion implantation under various implantation conditions such as impurity ion implanting density and acceleration energy are performed. As a result, a plurality of semiconductor regions with different densities are formed at different depths. The plurality of semiconductor regions are integrated to form the isolation region SP. Incidentally, a plurality of ion implantations performed with the multi-stage implantation may be performed under the same density condition.

Herein, at the same height (depth) as that of the N⁻ type semiconductor region N1 and the N⁻ type semiconductor region N2, the density of the P type impurity is lower than that of the deeper region than the N⁻ type semiconductor region N1 and the N⁻ type semiconductor region N2. This is due to the following: the region between the N⁻ type semiconductor region N1 and the N⁻ type semiconductor region N2 is the region which includes the P⁻ type well region WL formed therein, but has not been subjected to ion implantation for forming the isolation region SP. Thus, the isolation region SP is formed in the deeper region than the region between the N⁻ type semiconductor region N1 and the N⁻ type semiconductor region N2.

Incidentally, from the viewpoint of improving the electron isolation characteristic, in the deeper region than the N⁻ type semiconductor regions N1 and N2, the P type impurity density is ideally constant at any depth. However, it is difficult to implement such a density distribution by one-time ion implantation. Therefore, in the present embodiment, the isolation region SP is formed by multi-stage implantation. For this reason, across the region from the height of each bottom surface of the N⁻ type semiconductor regions N1 and N2 to the interface between the well region WL and the semiconductor substrate SB, the density distribution of the P type impurity in the isolation region SP has a plurality of density peaks in the depth direction of the semiconductor substrate SB. FIG. 5 shows the density distribution when all of the plurality of density peaks have almost the same density.

FIG. 6 shows the density distribution when the density peak at a part close to the main surface of the semiconductor substrate SB is higher in density than any density peak at deeper regions than the density peak. In other words, a plurality of first to nth density peaks are present in alignment from the main surface toward the back surface of the semiconductor substrate SB. The first density peak closest to the main surface of the semiconductor substrate SB has a higher P type impurity density than any of the respective second to nth density peaks.

FIG. 7 shows the density distribution when the density peak at a part close to the main surface of the semiconductor substrate SB is lower in density than any density peak at deeper regions than the density peak. In other words, a plurality of first to nth density peaks are present in alignment from the main surface toward the back surface of the semiconductor substrate SB. The P type impurity density at the first density peak closest to the main surface of the semiconductor substrate SB is lower than the P type impurity density at any of the respective second to nth density peaks.

The three patterns of density distributions of FIGS. 5 to 7 are all usable for the semiconductor device of the present embodiment. When the impurity density in the isolation region SP is high in the vicinity of the main surface as shown in FIG. 6, the isolation characteristic of the photoelectrically converted electrons generated by application of green and blue lights is advantageously favorable. In contrast, when the impurity density in the isolation region SP is high in the deeper region than the vicinity of the main surface as shown in FIG. 7, the isolation characteristic of the photoelectrically converted electrons generated by application of red light is advantageously favorable. Accordingly, the pixel including the isolation region SP having the density distribution shown in FIG. 6 is used as the pixel for receiving (for detecting) green and blue lights, and the pixel including the isolation region SP having the density distribution shown in FIG. 7 is used as the pixel for receiving (for detecting) red light. As a result, it is possible to improve the electron isolation characteristic in the light receiving pixel of each color.

Further, when the impurity density in the isolation region SP is low in the vicinity of the main surface as in the density distribution shown in FIG. 7, although the P type impurity forming the isolation region SP is diffused into the N⁻ type semiconductor regions N1 and N2, so that the number of electrons which can be accumulated in the photodiodes PD1 and PD2, in other words, the saturation electron number is reduced, the reduction can be prevented. Therefore, in the case of the density distribution of FIG. 7, the sensitivity characteristic of the pixel can be advantageously prevented from being reduced.

Figure 33:
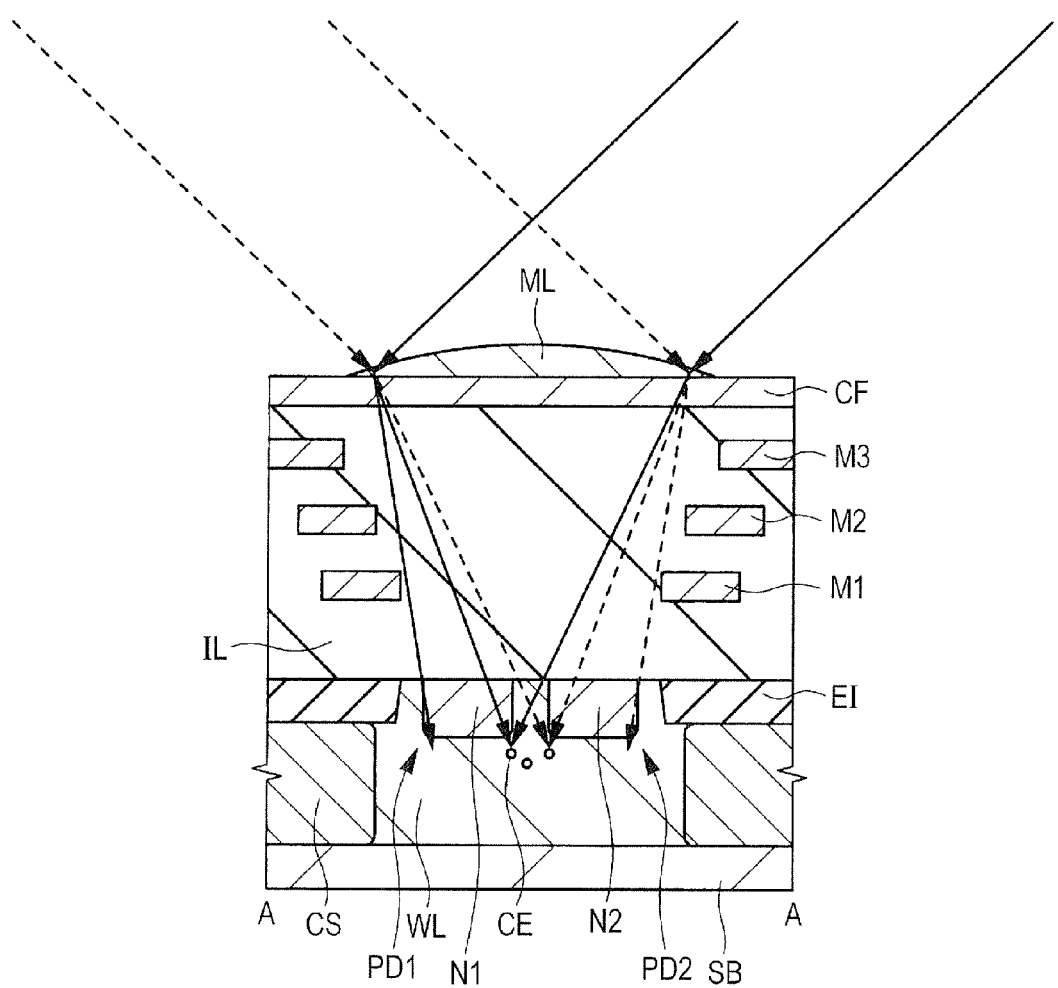
FIG. 33 is a cross sectional view showing a semiconductor device of Comparative Example.

Then, the effects of the semiconductor device of the present embodiment will be described by reference to FIGS. 33 and 34 as Comparative Example. FIG. 33 is a cross sectional view showing a pixel forming the semiconductor device of Comparative Example. Whereas, for FIG. 34, each image signal indicated with a broken line will be described.

The structure of the solid-state image sensing element shown in FIG. 33 has the same structure as that of the solid-state image sensing element of the present embodiment, except that the isolation region SP (see FIGS. 2 and 3) is not formed. Namely, immediately under the region between the N⁻ type semiconductor region N1 and the N⁻ type semiconductor region N2, a P⁻ type well region WL is formed as with the region, and respective regions immediately under the N⁻ type semiconductor region N1 and the N⁻ type semiconductor region N2.

In FIG. 33, the incident lights incident from the exit pupil (the camera lens) upon the solid-state image sensing element when one subjected is imaged are indicated with solid lines and broken lines. The incident lights are the lights incident in a split manner from left and right of the exit pupil. When the split incident lights indicated with the solid lines and the broken lines are respectively incident upon the two photodiodes in one pixel, the sensitivity regions overlap each other in the region between the photodiodes.

For example, the photoelectrically converted electrons CE generated in the well region WL at the points reached by the incident lights indicated with the solid lines, namely, the lights incident from the right side of the exit pupil should be accumulated in the N⁻ type semiconductor region N1 forming the photodiode PD1. Namely, the photoelectrically converted electrons CE generated on the left side with respect to the midpoint between the N⁻ type semiconductor region N1 and the N⁻ type semiconductor region N2 in FIG. 33 should be captured in the N⁻ type semiconductor region N1 situated on the left side with respect to the midpoint between the N⁻ type semiconductor region N1 and the N⁻ type semiconductor region N2.

However, isolation for preventing the movement of electrons is not established between the region immediately under the N⁻ type semiconductor region N1 and the region immediately under the N⁻ type semiconductor region N2. For this reason, the photoelectrically converted electrons CE generated on the left side with respect to the midpoint in FIG. 33 may move toward the photodiode PD2 side to be accumulated in the N⁻ type semiconductor region N2.

In this case, the photoelectrically converted electrons CE which should be accumulated in the N⁻ type semiconductor region N1 are accidentally accumulated in the N⁻ type semiconductor region N2. Accordingly, in the A-line pixel AL (see FIG. 34) formed of the photodiode PD1, a proper image signal cannot be acquired. Therefore, the image signals obtained when the autofocusing operation is performed using the solid-state image sensing element of Comparative Example shown in FIG. 33 become smaller collectively, and each have a gentle shape as with the signals indicated with broken lines in FIG. 34. This also applies to the photoelectrically converted electrons CE generated by the lights incident from the left side of the exit pupil, i.e., the incident lights indicated with the broken line in FIG. 33. In other words, the photoelectrically converted electrons CE which should be accumulated in the N⁻ type semiconductor region N2 may be accidentally accumulated in the N⁻ type semiconductor region N1. In this case, the image signals obtained from the B-line pixels BL shown in FIG. 34 become smaller collectively, and each have a gentle shape.

Thus, when imaging surface phase difference AF (Autofocus) signal detection is performed, false detection of the incident light between the two photodiodes often occurs. As a result, it becomes difficult to determine the focusing state with precision. In other words, the isolation characteristic of the observed signals is deteriorated. Accordingly, the detection precision of the focusing state in the autofocusing operation is deteriorated. As a result, the precision of autofocusing is reduced. Further, the time until focusing unfavorably increases.

Such a problem becomes particularly remarkable with a device reduced in pixel size. The reason for this is that the spacing between the N⁻ type semiconductor regions forming each photodiode becomes smaller. The electrons generated in the well region by photoelectric conversion may often pair-annihilate with holes in the well region. Thus, when the spacing between the N⁻ type semiconductor regions is made smaller, the electrons generated in the deep region of the semiconductor substrate between the two photodiodes can be captured in the photodiode. For this reason, the sensitivity of the pixel can be improved. However, when the two photodiodes come closer to each other, the probability becomes higher that the electrons generated in the deep region between the two photodiodes are captured in a false photodiode.

Further, when the size of the pixel in a plan view is reduced, the film thickness of the gate electrode forming the transistor in the pixel is reduced. Herein, when during the manufacturing steps of the semiconductor device, ion implantation is performed using the gate electrode as an ion implantation preventing mask, thereby to form the N⁻ type semiconductor region, ion implantation is required to be performed with an energy enough to prevent the impurity ions from penetrating through the thinned gate electrode. For this reason, the depth of the N⁻ type semiconductor region becomes smaller.

In this case, from the viewpoint of improving the sensitivity of each pixel, it becomes important to capture the photoelectrically converted electrons generated in the deeper region than the N⁻ type semiconductor regions into the photodiodes. However, when the two photodiodes are made closer to each other for the purposes of reducing the size of the pixel, and capturing the photoelectrically converted electrons generated in the deeper region than the N⁻ type semiconductor regions into the photodiodes, the probability becomes high that the electrons are captured in the false photodiode as described above. Namely, the isolation characteristic of photoelectrically converted electrons is deteriorated.

In contrast, with the semiconductor device of the present embodiment, as shown in FIGS. 2 and 3, a P⁺ type isolation region SP is provided immediately under the region between the N⁻ type semiconductor region N1 and the N⁻ type semiconductor region N2 aligned in the pixel PE. As a result, even when the electrons generated by photoelectric conversion in the well region WL at a deeper position than the region between the photodiodes PD1 and PD2 attempt to move to a more distant photodiode of the two photodiodes, the electrons are inhibited by the inclination of the electrostatic potential, and hence are captured into the photodiode nearest from the generation position.

Thus, the isolation region SP of the P type semiconductor region serves as a barrier when the photoelectrically converted electrons moves to a different photodiode from a prescribed photodiode. Accordingly, the probability becomes higher that the photoelectrically converted electrons generated in the well region WL under the region between the photodiode PD1 and the photodiode PD2 are captured into a prescribed photodiode.

Namely, the photoelectrically converted electrons generated on the N⁻ type semiconductor region N1 side with respect to the midpoint between the N⁻ type semiconductor region N1 and the N⁻ type semiconductor region N2 can be prevented from being captured into the N⁻ type semiconductor region N2. Therefore, it is possible to improve the isolation characteristic of the electrons generated in the well region WL immediately under the region between the N⁻ type semiconductor region N1 and the N⁻ type semiconductor region N2. As a result, it is possible to improve the detection precision of the focusing state in the imaging surface phase difference autofocusing operation. Accordingly, it is possible to improve the speed and the precision of focusing in the imaging surface phase difference autofocusing. For this reason, it is possible to improve the performances of the semiconductor device.

Incidentally, from the viewpoint of isolating the photodiodes PD1 and PD2, the isolation region SP is ideally formed not only in the region below the N⁻ type semiconductor region N1 and the N⁻ type semiconductor region N2, but also at a position including the main surface of the semiconductor substrate SB, and at the same height (depth) as that of the N⁻ type semiconductor region N1 and the N⁻ type semiconductor region N2.

However, when the isolation region SP is formed at the same height as that of the N⁻ type semiconductor region N1 and the N⁻ type semiconductor region N2, the P type impurity forming the isolation region SP is diffused into the N⁻ type semiconductor region N1 and into the N⁻ type semiconductor region N2. This results in a reduction of the number of electrons which can be accumulated in the photodiodes PD1 and PD2, in other words, the saturation electron number. In this case, the sensitivity performance of the pixel PE is reduced. Particularly, B (boron) of a P type impurity tends to be diffused. For this reason, the probability is high that such a problem is caused. Accordingly, the isolation region SP is desirably formed in a region below the N⁻ type semiconductor region N1 and the N⁻ type semiconductor region N2.

Figure 8:
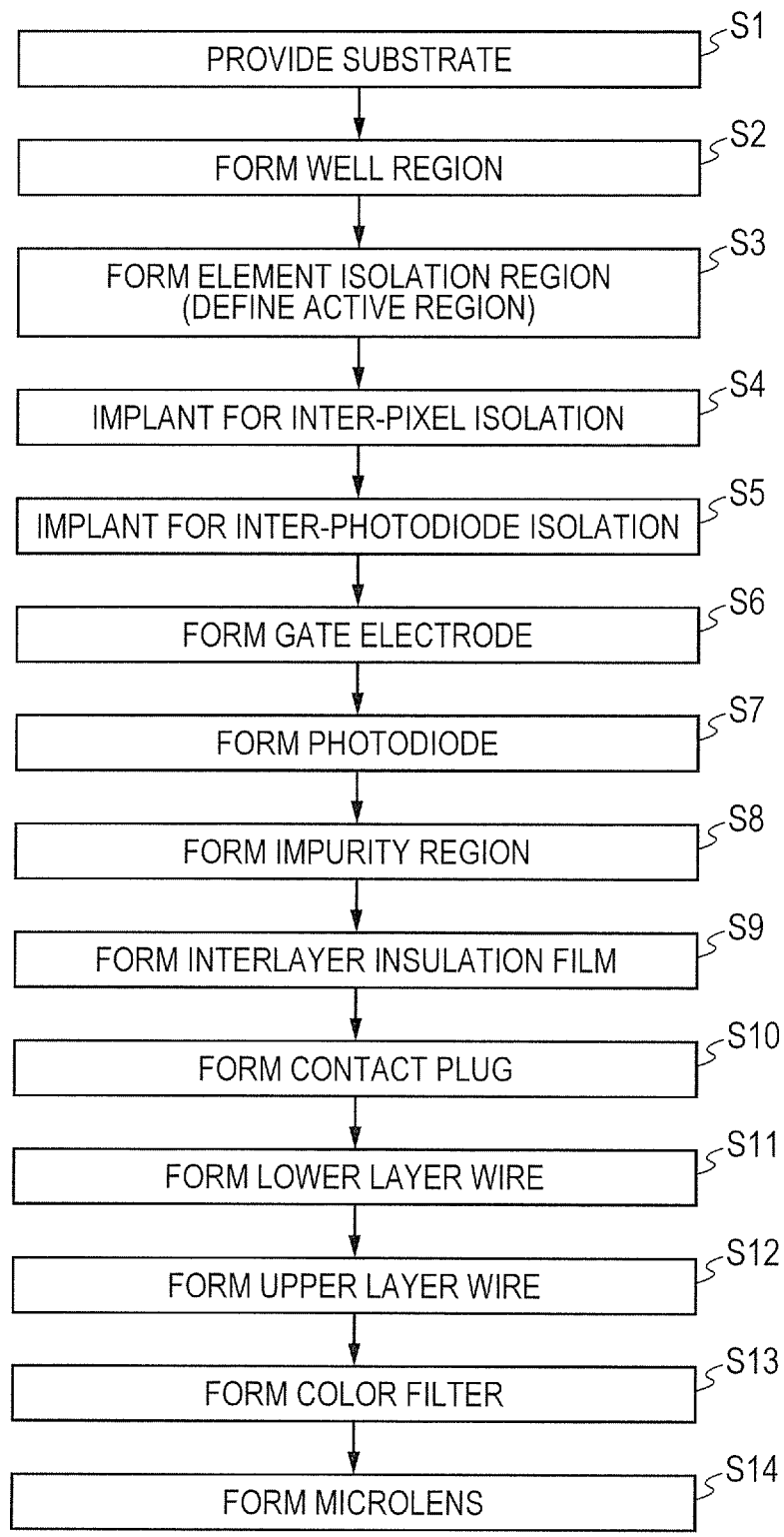
FIG. 8 is a view showing the flow of the manufacturing steps of the semiconductor device of First Embodiment of the present invention.

Below, a method for manufacturing a semiconductor device of the present embodiment will be described by reference to FIGS. 8 to 26. FIG. 8 is a view showing the flow of the manufacturing steps of the semiconductor device of the present embodiment. FIGS. 9, 11, 13, 15, 17, 19, 22, 24, and 26 are each a cross sectional view for illustrating the semiconductor device of the present embodiment during a manufacturing step. FIGS. 10, 12, 14, 16, 18, 20, 21, 23, and 25 are each a plan view for illustrating the semiconductor device of the present embodiment during a manufacturing step.

Whereas, herein, a description will be given assuming a four-transistor type pixel for use as a pixel realization circuit in a CMOS image sensor as one example of the pixel, which is not exclusive. Below, a description will be given by reference to a plan view in which some transistors, and the like of such a pixel are omitted, and only photodiodes and a floating diffusion capacitance part are shown.

FIGS. 11, 13, 15, 17, 19, 22, 24, and 26 are views showing the cross sections along lines A-A of FIGS. 10, 12, 14, 16, 18, 21, 23, and 25, respectively. In the plan views for use in the following description, the interlayer insulation film is not shown, and in some cases, some wires over the substrate are not shown.

Figure 9:
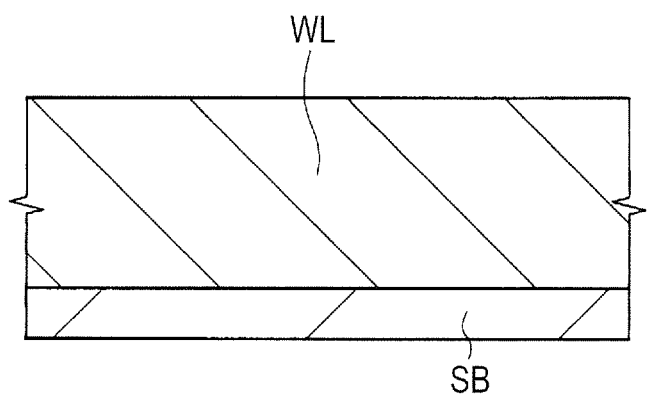
FIG. 9 is a cross sectional view for illustrating the semiconductor device of First Embodiment of the present invention during a manufacturing step.

First, as shown in FIG. 9, a semiconductor substrate SB is provided (Step S1 of FIG. 8). Then, a well region WL is formed in the upper surface of the semiconductor substrate SB (Step S2 of FIG. 8). The semiconductor substrate SB is formed of, for example, single crystal silicon (Si). The well region WL is formed by doping the main surface of the semiconductor substrate SB with a P type impurity (e.g., B (boron)) by an ion implantation method, or the like. The well region WL is a P$^-$ type semiconductor region having a relatively lower impurity density.

Figure 10:
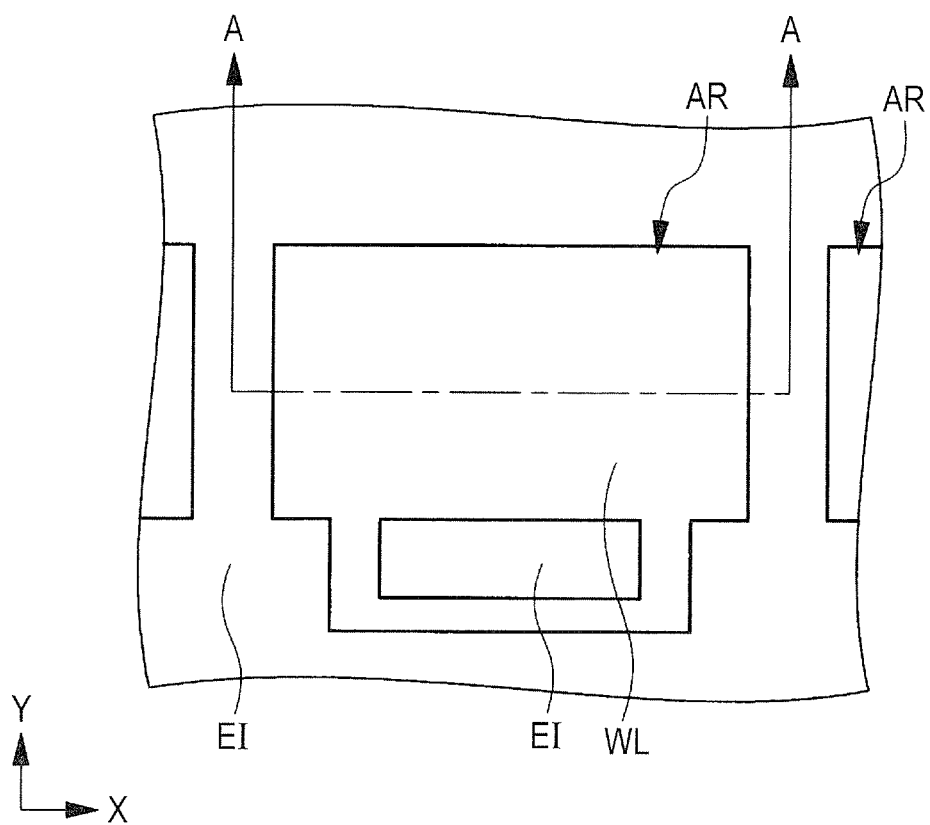
FIG. 10 is a plan view for illustrating the semiconductor device during a manufacturing step following FIG. 9.
Figure 11:
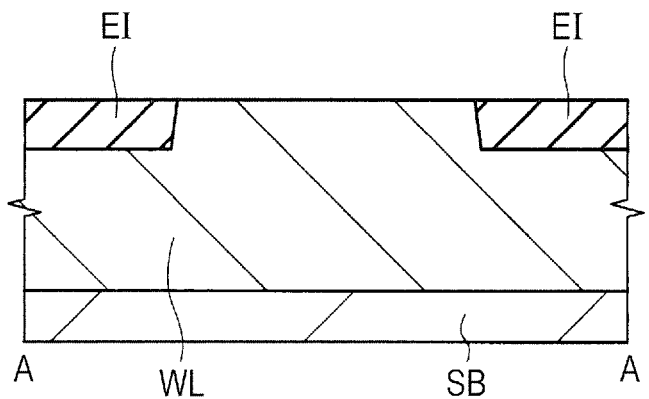
FIG. 11 is a cross sectional view for illustrating the semiconductor device during a manufacturing step following FIG. 9.

Then, as shown in FIGS. 10 and 11, trenches are formed in the main surface of the semiconductor substrate SB, and element isolation regions EI are formed in the trenches, respectively. (Step S3 of FIG. 8). As a result, the region in which the upper surface of the semiconductor substrate SB is exposed, i.e., the active region is defined (partitioned) from the element isolation regions EI. The element isolation region EI can be formed by, for example, a STI (Shallow Trench Isolation) method, or a LOCOS (Local Oxidization of Silicon) method. Herein, the element isolation region EI is formed by a STI method. The well region WL is formed entirely in the upper surface of the semiconductor substrate SB in the active region AR.

Herein, a description will be given to the case where the active region AR is defined after the formation of the well region WL. However, conversely, the well region WL may also be formed after the formation of the element isolation region EI. In that case, a P type impurity is implanted with such an acceleration energy as to penetrate through the active region AR and the element isolation region EI, thereby to form the well region WL.

Further, as shown in FIG. 10, the active region AR surrounded by the element isolation regions EI has a region in which a light receiving part including two photodiodes is formed in a later step, and a region for forming therein a floating diffusion capacitance part which is the drain region of each transfer transistor, and accumulates electric charges therein. The region for forming a light receiving part therein has a rectangular shape in a plan view. The opposite ends of the region for forming the floating diffusion capacitance part therein are in contact with one side of the four sides of the light receiving part forming region. In other words, the active region AR has an annular structure formed of the two regions. The element isolation region EI is formed at the part surrounded by the two regions.

In other words, the floating diffusion capacitance part forming region has a shape in which the two patterns projecting from two parts of the one side of the light receiving part forming region toward the element isolation region EI side are coupled with each other at one part. Incidentally, the two projecting patterns of the floating diffusion capacitance part forming region are not required to be coupled with each other. In this case, the active region AR does not have an annular structure. As shown in FIG. 11, the formation depth of the element isolation region EI is shallower than the bottom of the well region WL.

Figure 12:
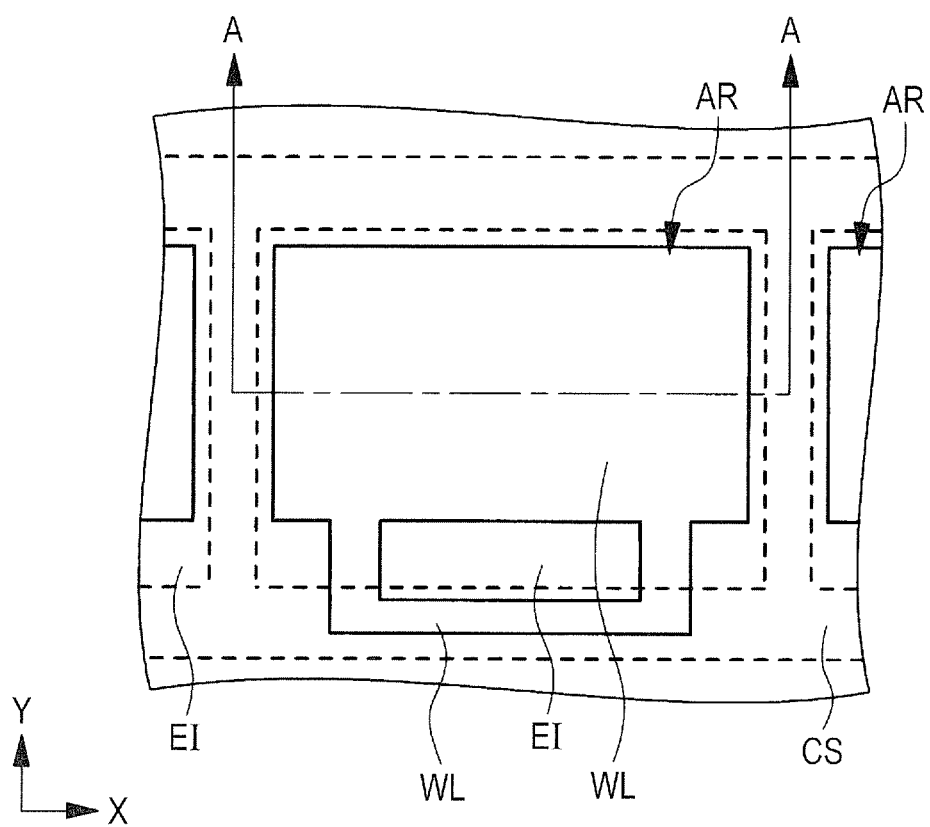
FIG. 12 is a plan view for illustrating the semiconductor device during a manufacturing step following FIG. 10.
Figure 13:
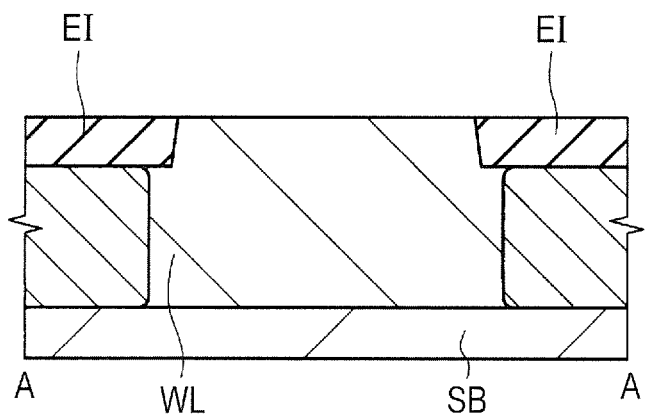
FIG. 13 is a cross sectional view for illustrating the semiconductor device during a manufacturing step following FIG. 10.

Then, as shown in FIGS. 12 and 13, impurity implantation for isolating the photodiodes to be formed later from each other, i.e., inter-pixel isolating implantation is performed (Step S4 of FIG. 8). Specifically, a P type impurity (e.g., B (boron)) is implanted into the upper surface of the semiconductor substrate SB, and the region surrounding the photodiodes forming region by an ion implantation method, or the like. As a result, a pixel isolation region CS of a P$^+$ type semiconductor region is formed in the upper surface of the semiconductor substrate SB. The ion implantation for forming the pixel isolation region CS is performed by multi-stage implantation including a plurality of times, for example, about 5 to 7 times of the ion implantation step.

Herein, the pixel isolation region CS is formed in the region overlapping the element isolation region EI in a plan view. The pixel isolation region CS is formed deeper than the N$^-$ type semiconductor region forming the photodiode formed later. Herein, the pixel isolation region CS is formed from the interface between the bottom surface of the element isolation region EI and the upper surface of the semiconductor substrate SB across to the lower surface of the well region WL. By performing inter-pixel isolating implantation, a potential barrier against electrons is formed among pixels formed later. This can prevent the electrons from being diffused into the adjacent pixels, which can improve the sensitivity characteristic of the image sensing element.

Figure 14:
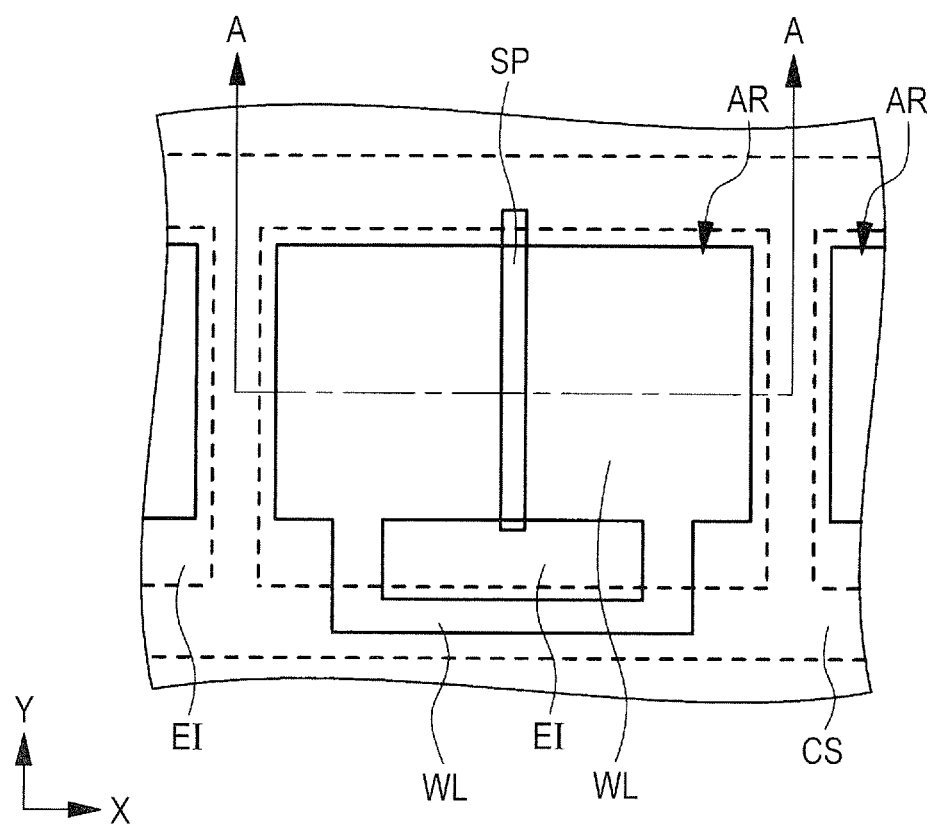
FIG. 14 is a plan view for illustrating the semiconductor device during a manufacturing step following FIG. 12.
Figure 15:
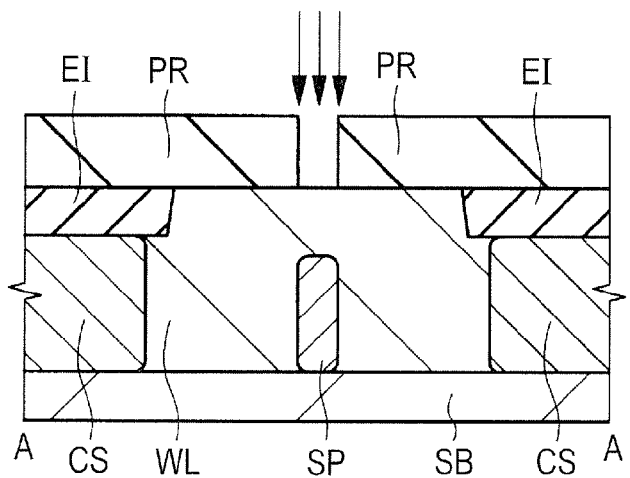
FIG. 15 is a cross sectional view for illustrating the semiconductor device during a manufacturing step following FIG. 12.

Then, as shown in FIGS. 14 and 15, impurity implantation for isolating the two photodiodes in the pixel formed later from each other, i.e., inter-photodiode isolating implantation is performed (Step S5 of FIG. 8). Herein, a P type impurity (e.g., B (boron)) is implanted into the upper surface of the semiconductor substrate SB, and between the regions for forming two photodiodes to be formed in the active region AR in a later step, respectively, by an ion implantation method, or the like. As a result, an isolation region SP of a P$^+$ type semiconductor region is formed in the upper surface of the semiconductor substrate SB.

The isolation region SP has a shape extending from one side of the active region AR having a rectangular planar shape in such a manner as to reach the other side opposing the one side. Both of the opposite ends of the isolation region SP overlap the element isolation region EI in a plan view. In other words, both the opposite ends of the isolation region SP are formed under the element isolation region EI. As shown in FIG. 14, a part of the isolation region SP may overlap the pixel isolation region CS in a plan view. The projecting patterns are formed at respective one sides of the active regions AR divided by the isolation region SP, and situated on the left and right sides of the isolation region SP in a plan view, respectively.

In the present embodiment, the pixel isolation region CS and the isolation region SP are formed by separate ion implantation steps. For this reason, as described by reference to FIG. 35 later, it is possible to prevent the occurrence of the following problem caused when the pixel isolation region CS and the isolation region SP are formed by the same ion implantation step; in the vicinity of the regions in contact with the pixel isolation region CS and the isolation region SP, the P type impurity forming the pixel isolation region CS or the isolation region SP is diffused into the photodiode forming region. Therefore, it is possible to prevent the reduction of the sensitivity of the pixel caused due to the reduction of the saturation electron number of the photodiode.

The isolation region SP is not formed in the vicinity of the main surface of the semiconductor substrate SB, but is formed from the intermediate depth across to the lower surface of the well region WL. The term the vicinity of the main surface of the semiconductor substrate SB" herein used denotes the region at the same height as the depth from the main surface of the semiconductor substrate SB to the bottom surface of the $N^-$ type semiconductor region formed in a later step, and forming the photodiode.

The ion implantation performed for forming the pixel isolation region CS is performed by, for example, one-time ion implantation step, or a plurality of times, about 3 or 4 times, of ion implantation steps. The density distribution of the isolation region SP from the shallow region across to the deep region of the well region WL shown in FIG. 15 is made constant as much as possible, thereby to suppress the variations in isolation characteristics of the photoelectrically converted electrons. To this end, the isolation region SP is preferably formed by multi-stage implantation of about 3 or 4 times.

Herein, a P type impurity (e.g., B (boron)) is implanted in a multi-stage manner from over the mask pattern formed of a photoresist film PR into the main surface of the semiconductor substrate SB at an acceleration energy of about 300 to 1500 KeV. As a result, the isolation region SP is formed. Herein, the density of the impurity implanted toward the main surface of the semiconductor substrate SB is, for example, about $1 \times 10^{11}$ to $10^{13}$ cm$^{-2}$ Thus, impurity ions are implanted into the regions at different depths in the semiconductor substrate SB, respectively. This results in the formation of the isolation region SP having density peaks at a plurality of different depths. The isolation region SP formed by multi-stage implantation has the density distribution as shown in any of FIG. 5, 6, or 7. When the isolation region SP is formed by one-time implantation without performing multi-stage implantation, the number of density peaks thereof is only one.

When the isolation region SP is formed by multi-stage implantation, the photoresist film for use as a mask in ion implantation for forming the isolation region SP is required to have a film thickness enough to prevent the impurity ions from penetrating therethrough in ion implantation to be performed with the highest energy of the multi-stage implantation steps. In other words, the film thickness of the resist pattern formed of the photoresist film is determined by the ion implantation energy for forming the isolation region SP, or the like.

Herein, the width of the isolation region SP in the Y axis direction (transverse direction) is desirably a minimum dimension. The minimum dimension is determined by the film thickness of the resist pattern for use as a mask in the ion implantation step performed for forming the isolation region SP. Namely, when the film thickness of the resist pattern is determined, the minimum necessary opening width of the resist pattern for forming the semiconductor region by ion implantation with stability is determined. As a result, the minimum dimension of the isolation region SP in the transverse direction is determined.

Figure 16:
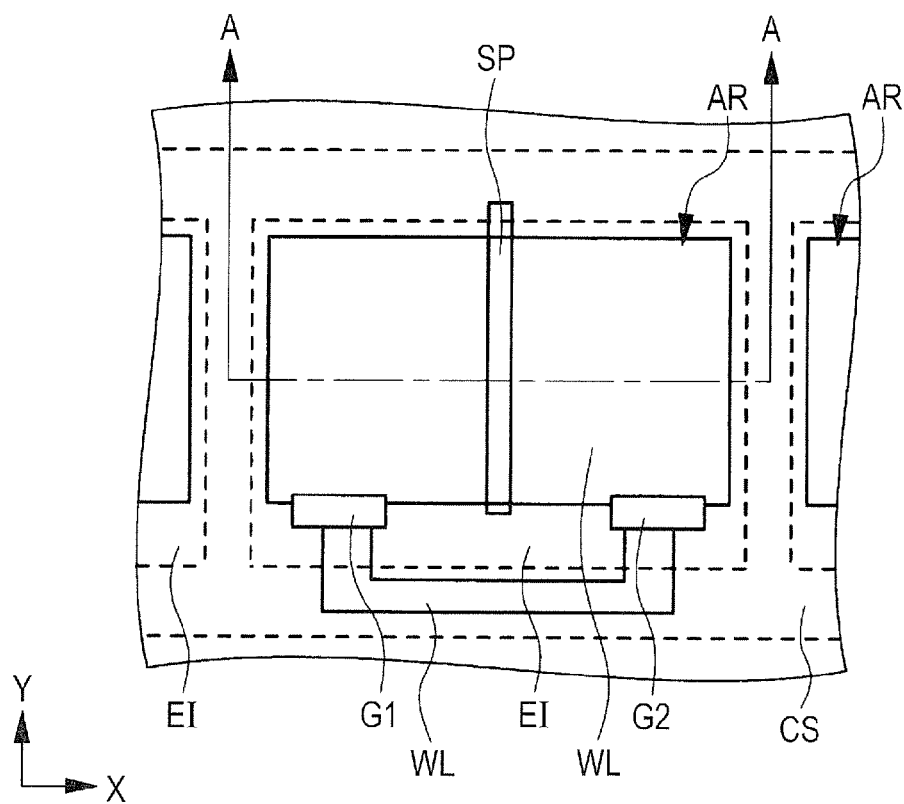
FIG. 16 is a plan view for illustrating the semiconductor device during a manufacturing step following FIG. 14.
Figure 17:
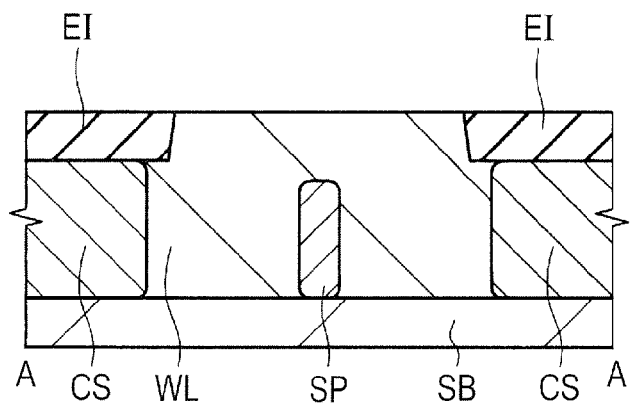
FIG. 17 is a cross sectional view for illustrating the semiconductor device during a manufacturing step following FIG. 14.

Then, as shown in FIGS. 16 and 17, a gate electrode is formed over the semiconductor substrate SB via a gate insulation film (Step S6 of FIG. 8). Herein, the gate electrodes G1 and G2 are formed over the boundary between the light receiving part forming region and the floating diffusion capacitance part forming region of the active region AR via the gate insulation film (not shown). In other words, the gate electrode G1 is formed immediately over one of the patterns of the active region AR projecting from the two parts of one side of the light receiving part forming region, and the gate electrode G2 is formed immediately over the other pattern. The gate electrodes G1 and G2 form the gate electrodes of the transfer transistors formed later, respectively. Herein, in the region not shown, a gate electrode of a peripheral transistor to be formed later is also formed.

Figure 18:
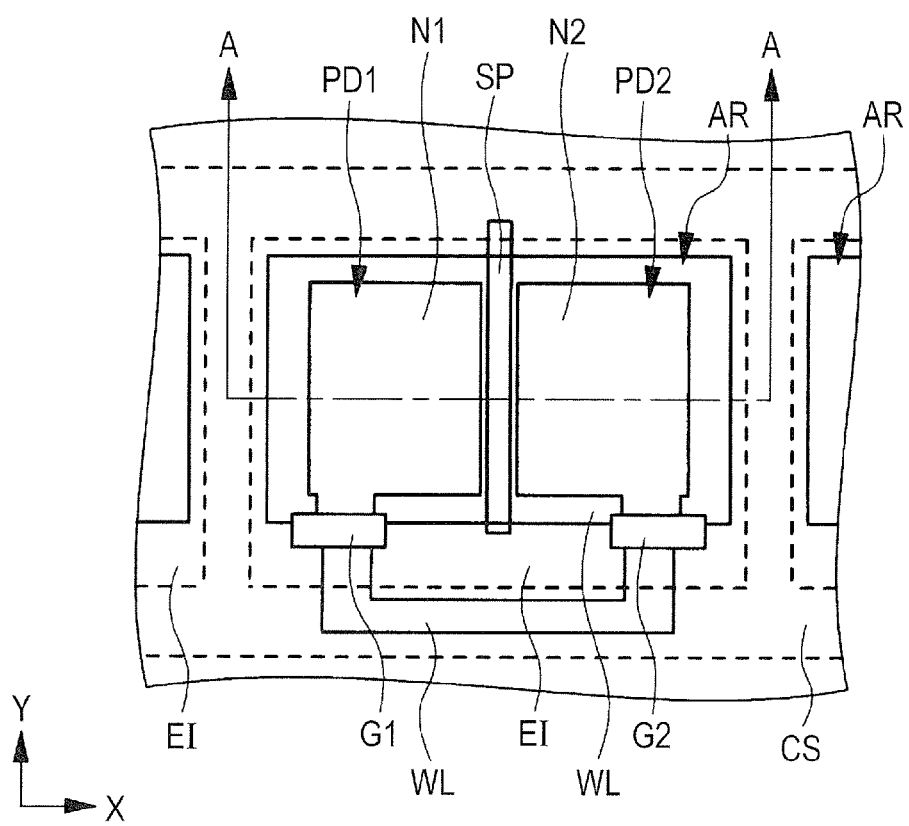
FIG. 18 is a plan view for illustrating the semiconductor device during a manufacturing step following FIG. 16.
Figure 19:
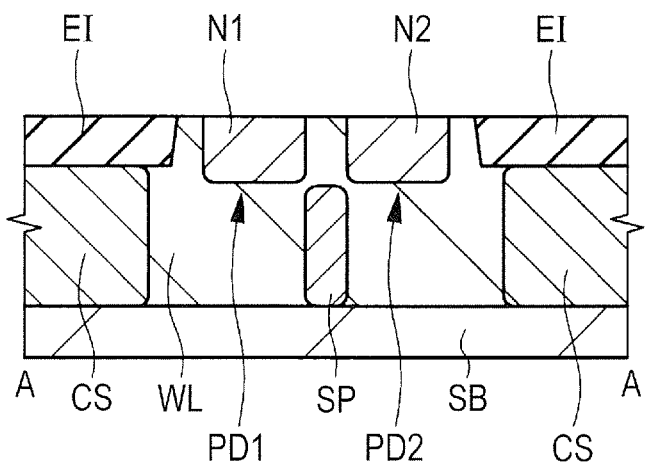
FIG. 19 is a cross sectional view for illustrating the semiconductor device during a manufacturing step following FIG. 16.

Then, as shown in FIGS. 18 and 19, a photodiode PD1 including the $N^-$ type semiconductor region N1, and a photodiode PD2 including the $N^-$ type semiconductor region N2 are formed at the upper surface of the semiconductor substrate SB (Step S7 of FIG. 8). Namely, an N type impurity (e.g., arsenic (As) or P (phosphorus)) is implanted into the main surface of the semiconductor substrate SB by, for example, an ion implantation method. As a result, the $N^-$ type semiconductor regions N1 and N2 are formed in the light receiving part forming region of the active region AR. The $N^-$ type semiconductor regions N1 and N2 are formed in such a manner as to interpose the isolation region SP therebetween in the X direction.

Herein, the implantation by the ion implantation method is performed using the photoresist film (not shown) formed using a photolithography technology, and the gate electrodes G1 and G2 as a mask. As a result, the $N^-$ type semiconductor regions N1 and N2 are formed apart from each other at the upper surface of the active region AR. The $N^-$ type semiconductor regions N1 and N2 each have a generally rectangular shape in a plan view. At this step, the opposing sides of the $N^-$ type semiconductor regions N1 and N2 adjacent to each other are desirably formed in such a manner as not to overlap the isolation region SP. Further, the $N^-$ type semiconductor regions N1 and N2 are formed in the shallower region than the isolation region SP in the vicinity of the main surface of the semiconductor substrate SB.

A part of the $N^-$ type semiconductor region N1 is formed in the region of the semiconductor substrate SB adjacent to the gate electrode G1, and a part of the $N^-$ type semiconductor region N2 is formed in the region of the semiconductor substrate SB adjacent to the gate electrode G2. In other words, the $N^-$ type semiconductor region N1 is a field effect transistor having the gate electrode G1, and forms the source region of a transfer transistor TX1 formed in a later step. Whereas, the $N^-$ type semiconductor region N2 is a field effect transistor having the gate electrode G2, and forms the source region of a transfer transistor TX2 formed in a later step.

A part of the main surface of the semiconductor substrate SB immediately under each of the gate electrodes G1 and G2 is a channel region, where the $N^-$ type semiconductor regions N1 and N2 are not formed. As shown in FIG. 19, each formation depth of the $N^-$ type semiconductor regions N1 and N2 is deeper than that of the element isolation region EI, shallower than that of the well region WL, and shallower than the position of the upper surface of the isolation region SP.

Figure 20:
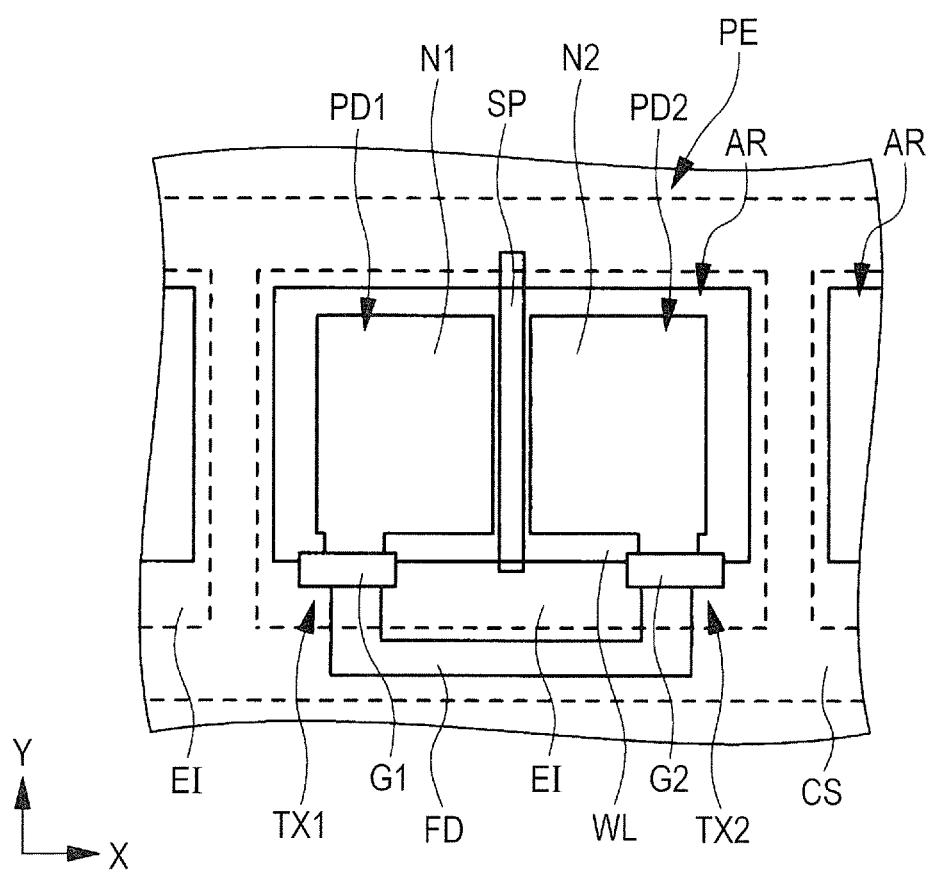
FIG. 20 is a plan view for illustrating the semiconductor device during a manufacturing step following FIG. 18.

Then, as shown in FIG. 20, an N type impurity (e.g., arsenic (As) or P (phosphorus)) is implanted into a part of the active region AR by, for example, an ion implantation method. As a result, a floating diffusion capacitance part FD of an N type impurity region is formed (Step S8 of FIG. 8). This results in the formation of a transfer transistor TX1 having the floating diffusion capacitance part FD as a drain region, having the N⁻ type semiconductor region N1 as a source region, and further having the gate electrode G1, and a transfer transistor TX2 having the floating diffusion capacitance part FD as a drain region, having the N⁻ type semiconductor region N2 as a source region, and further having the gate electrode G2. Further, in this step, the source/drain regions are formed in a region not shown, thereby to form a reset transistor, an amplification transistor, and a selection transistor of peripheral transistors.

The floating diffusion capacitance part FD is formed in the region projecting from the rectangular light receiving part of the active region AR. In other words, the active region AR is divided into the light receiving part having the photodiodes PD1 and PD2, and the floating diffusion capacitance part FD with the gate electrodes G1 and G2 as the boundary therebetween in a plan view. The transfer transistors TX1 and TX2 have the floating diffusion capacitance part FD of their mutual drain region in common. Incidentally, respective drain regions of the transfer transistors TX1 and TX2 may be separated from each other in layout. In that case, their respective divided drain regions are electrically coupled with each other via contact plugs and a wire formed later.

By the steps up to this point, a pixel PE including the photodiodes PD1 and PD2, the transfer transistors TX1 and TX2, and other peripheral transistors (not shown) is formed. Although not shown, a plurality of the pixels PE are formed in a matrix in the pixel array part over the semiconductor substrate SB.

When the N type photodiode is formed, the drain region is formed with a larger N type impurity density than the N type impurity density of each impurity in the N⁻ type semiconductor regions N1 and N2. Alternatively, an impurity such as a P⁺ type impurity (e.g., B (boron)) is implanted into the surface portions of the photodiode regions such as the N⁻ type semiconductor regions N1 and N2 shown in FIG. 19 shallower than the N⁻ type semiconductor regions N1 and N2, thereby to form a P⁺ layer. Such a photodiode forming method may be used. However, in the following description, the case where the P⁺ layer in the surface is not present will be described.

Figure 21:
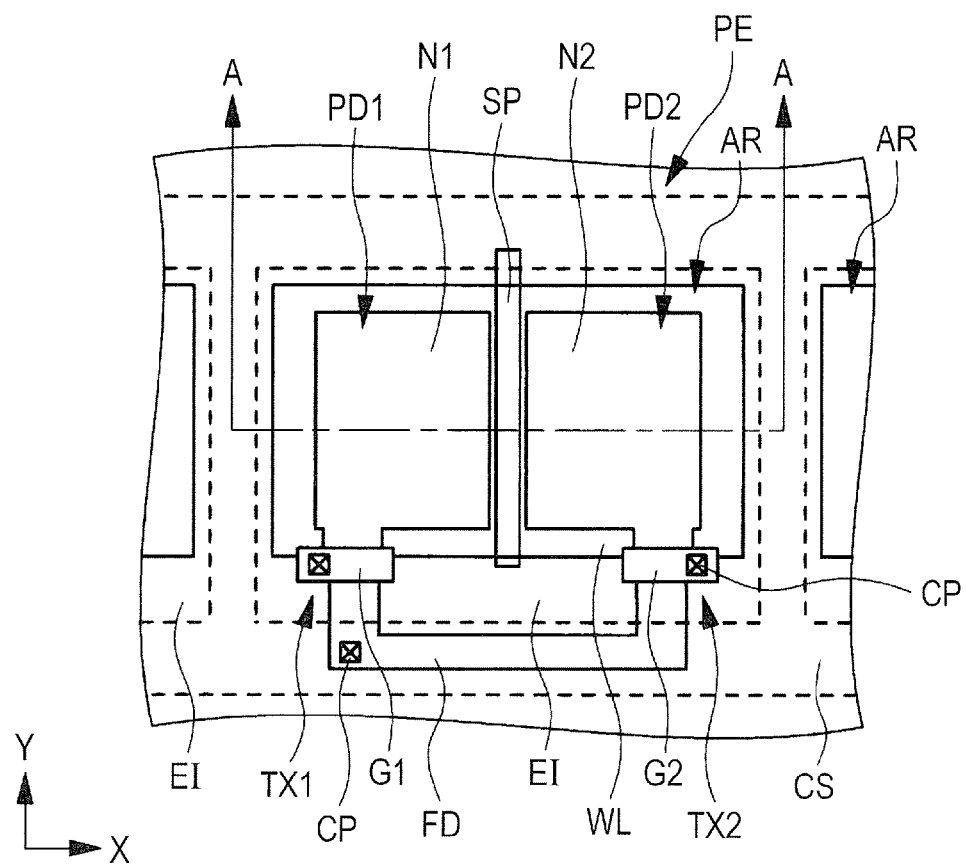
FIG. 21 is a plan view for illustrating the semiconductor device during a manufacturing step following FIG. 20.
Figure 22:
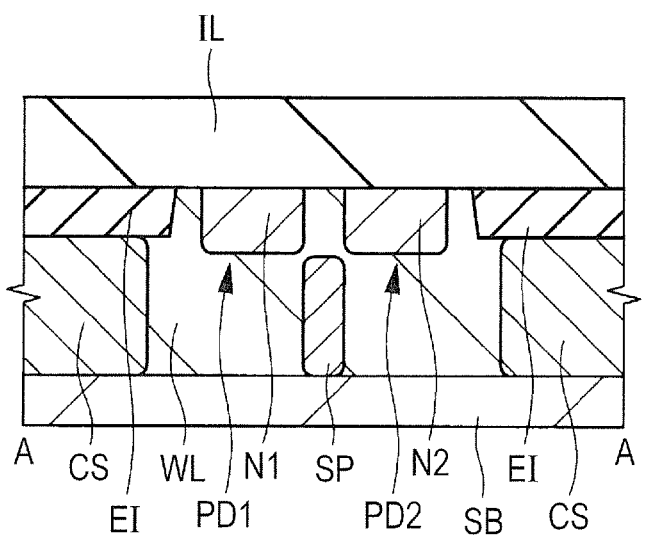
FIG. 22 is a cross sectional view for illustrating the semiconductor device during a manufacturing step following FIG. 20.

Then, as shown in FIGS. 21 and 22, an interlayer insulation film IL is formed over the semiconductor substrate (Step S9 of FIG. 8). Then, a contact plug CP penetrating through the interlayer insulation film IL is formed (Step S10 of FIG. 8).

Herein, over the main surface of the semiconductor substrate SB, the interlayer insulation film IL formed of, for example, a silicon oxide film is formed by, for example, a CVD (Chemical Vapor Deposition) method in such a manner as to cover the transfer transistors TX1 and TX2, the photodiodes PD1 and PD2, and the like. Then, a photoresist pattern is formed over the interlayer insulation film IL. Using the photoresist pattern as a mask, dry etching is performed. This results in the formation of contact holes for exposing the gate electrode G1, the gate electrode G2, and the floating diffusion capacitance part FD, respectively. Herein, a silicide layer may be formed at each upper surface of the gate electrode G1, the gate electrode G2, and the floating diffusion capacitance part FD. At this step, a contact hole is not formed immediately over the light receiving part including the photodiodes PD1 and PD2.

Subsequently, a metal film is formed over the interlayer insulation film IL including the insides of a plurality of contact holes. Then, the metal film over the interlayer insulation film IL is removed by being polished by, for example, a CMP (Chemical Mechanical Polishing) method. This results in the formation of contact plugs CP each formed of the metal film embedded in the plurality of contact holes, respectively. Each contact plug CP is formed of, for example, a lamination film of a titanium nitride film covering the sidewall and the bottom surface in the contact hole, and a tungsten film embedded over the bottom surface in the contact hole via the titanium nitride film.

Then, although not shown, an interlayer insulation film and a first wiring layer formed of a wire M1 (see FIGS. 23 and 24) of an underlayer wire are formed over the interlayer insulation film IL (Step S11 of FIG. 8). The underlayer wire is formed by a so-called single damascene method.

Herein, over the interlayer insulation film IL, an interlayer insulation film formed of, for example, a silicon oxide film is formed using, for example, a CVD method. Then, the interlayer insulation film is processed using a photolithography technique and a dry etching method. This results in the formation of a wiring trench which is an opening penetrating through the interlayer insulation film, and exposes the upper surface of the interlayer insulation film IL, and the upper surface of the contact plug CP. Subsequently, a metal film is formed over the interlayer insulation film including the inside of the wiring trench. The excess portion of the metal film over the interlayer insulation film is removed by a CMP method, or the like. This results in the formation of the wire M1 (see FIGS. 23 and 24) formed of the metal film embedded in the wiring trench. The wire M1 is not formed immediately over the photodiodes PD1 and PD2.

The wire M1 has, for example, a lamination structure of a tantalum nitride film and a copper film stacked sequentially one over another. The sidewall and the bottom surface in the wiring trench are covered with a tantalum nitride film. The wire M1 is coupled with the upper surface of the contact plug CP at the bottom surface thereof.

Figure 23:
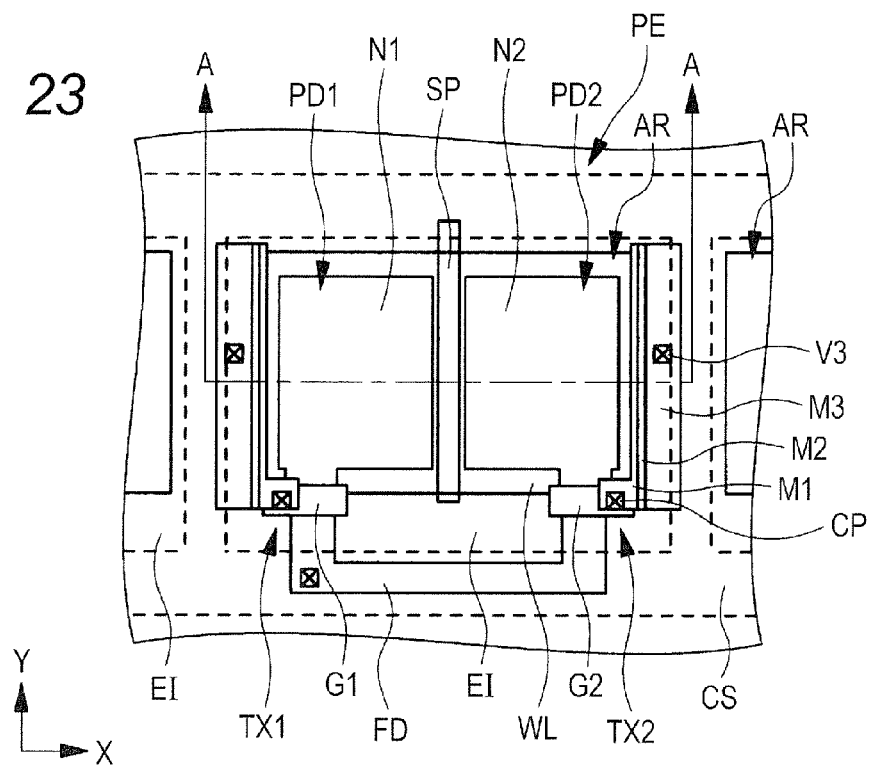
FIG. 23 is a plan view for illustrating the semiconductor device during a manufacturing step following FIG. 21.
Figure 24:
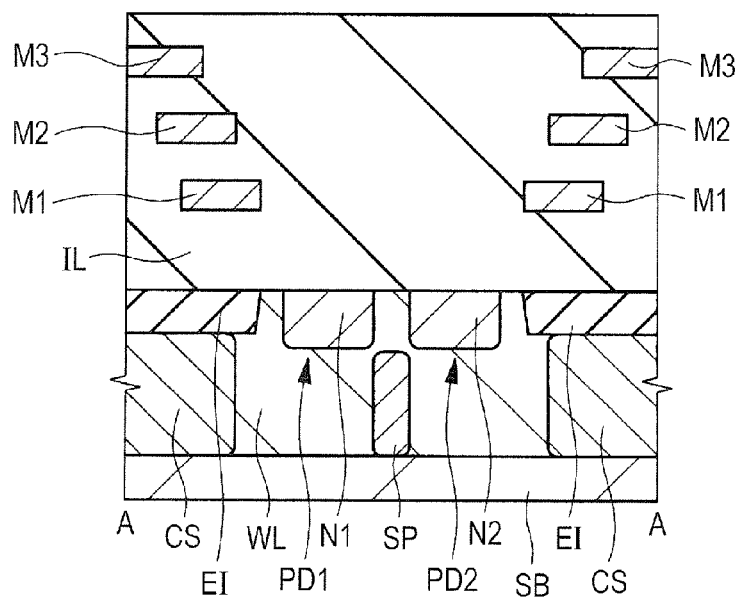
FIG. 24 is a cross sectional view for illustrating the semiconductor device during a manufacturing step following FIG. 21.

Then, as shown in FIGS. 23 and 24, a plurality of wiring layers including the upper layer wires are stacked over the interlayer insulation film (Step S12 of FIG. 8). This results in the formation of a lamination wiring layer formed of the interlayer insulation film, a plurality of interlayer insulation films over the interlayer insulation film, the wire M1, and wires M2 and M3 of the upper layer wires stacked over the wire M1. Herein, the wire M2 is formed over the wire M1 via a via (not shown). The wire M3 is formed over the wire M2 via a via (not shown). Respective upper layer wires and their respective vias under the upper layer wires are formed by a so-called dual damascene method. In FIG. 24, the plurality of interlayer insulation films stacked over the semiconductor substrate SB are shown as one interlayer insulation film IL.

The wire M2 and the wire M3 are formed at positions more distant from the photodiodes PD1 and PD2 than the wire M1. In other words, a wire is not formed over each of the photodiodes PD1 and PD2. Further, the interlayer insulation film IL is formed over the wire M3 which is the uppermost layer wire in the lamination wiring layer. In FIG. 23, the via V3 formed between the wire M3 and the wire M2 is shown as seen through the wire M3.

The dual damascene method is a method as follows: for example, a via hole penetrating through an interlayer insulation film is formed; then, a wiring trench shallower than the via hole is formed in the upper surface of the interlayer insulation film; then, a metal is embedded in the via hole and the wiring trench; as a result, the via in the via hole and the wire in the wiring trench thereover are formed at the same time. However, the following is also acceptable: after the formation of a wiring trench, a via hole penetrating from the bottom surface of the wiring trench to the bottom surface of the interlayer insulation film is provided. The via, and the wires M2 and M3 are each mainly formed of a copper film. The wire M1 is electrically coupled with the wire M3 via the via and the wire M2.

Figure 25:
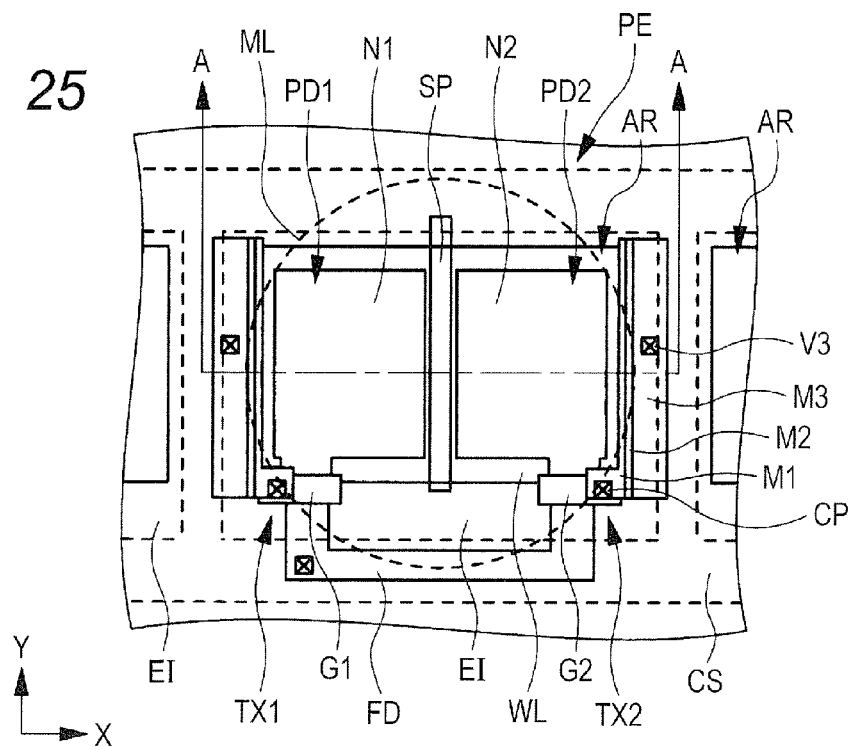
FIG. 25 is a plan view for illustrating the semiconductor device during a manufacturing step following FIG. 23.
Figure 26:
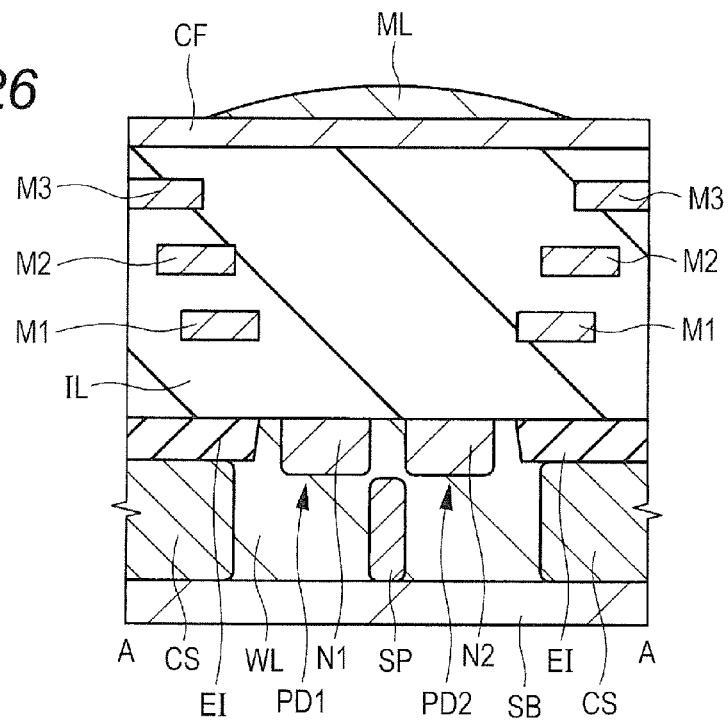
FIG. 26 is a cross sectional view for illustrating the semiconductor device during a manufacturing step following FIG. 23.

Then, as shown in FIGS. 25 and 26, a color filter CF is formed over the interlayer insulation film IL (Step S13 of FIG. 8). Then, a microlens ML is formed over the color filter CF, and immediately over the pixel PE (Step S14 of FIG. 8). In FIG. 25, the outline of the microlens ML is indicated with a broken line. In a plan view, the microlens ML and the photodiodes PD1 and PD2 overlap each other.

Herein, one pixel PE has, other than the photodiodes PD1 and PD2, and the floating diffusion region (floating diffusion), other transistors forming the pixel. However, the other transistors are not shown in the drawing for convenience.

The color filter CF is formed by, for example, embedding a film formed of a material for transmitting a light with a prescribed wavelength therethrough, and blocking lights with other wavelengths in the trench formed in the upper surface of the interlayer insulation film IL'. The formation of the color filter CF enables, for example, only a light of a specific color to be applied to the photodiodes PD1 and PD2. However, when the color of the light to be detected using the pixel is not required to be restricted, the color filter CF is not required to be formed.

The microlens ML over the color filter CF is formed in the following manner: the film formed over the color filter CF is processed into a circular pattern in a plan view; then, for example, the film is heated, thereby to round the surface of the film; as a result, the film is processed into a lens form.

In the subsequent steps, the scribe lines of the semiconductor substrate SB, i.e., the semiconductor wafer are cut by dicing. Thus, the semiconductor wafer is singulated into a plurality of sensor chips, thereby to form a plurality of solid-state image sensing elements formed of the sensor chips. This results in the completion of the semiconductor device of the present embodiment including the solid-state image sensing element.

The main feature of the present embodiment resides in that the isolation region SP for isolating the photoelectrically converted electrons generated in the well region WL immediately under each of the N$^-$ type semiconductor regions N1 and N2 is formed in the deeper region than the N$^-$ type semiconductor regions N1 and N2. When the method for manufacturing the semiconductor device of the present embodiment is used, it is possible to obtain the same effects as the effects described by reference to FIGS. 2, 3, 33, and 34, and the like.

Incidentally, herein, a description has been given the following: as shown in FIG. 8, after the formation step of the pixel isolation region, and before the formation step of the gate electrode, inter-photodiode isolating implantation is performed. However, the ion implantation performed for forming the isolation region SP (see FIG. 25) may be performed at any time point, so long as the time point is after the well region formation step (Step S2 of FIG. 8), and before the impurity region formation step (Step S8 of FIG. 8).

Second Embodiment

Figure 27:
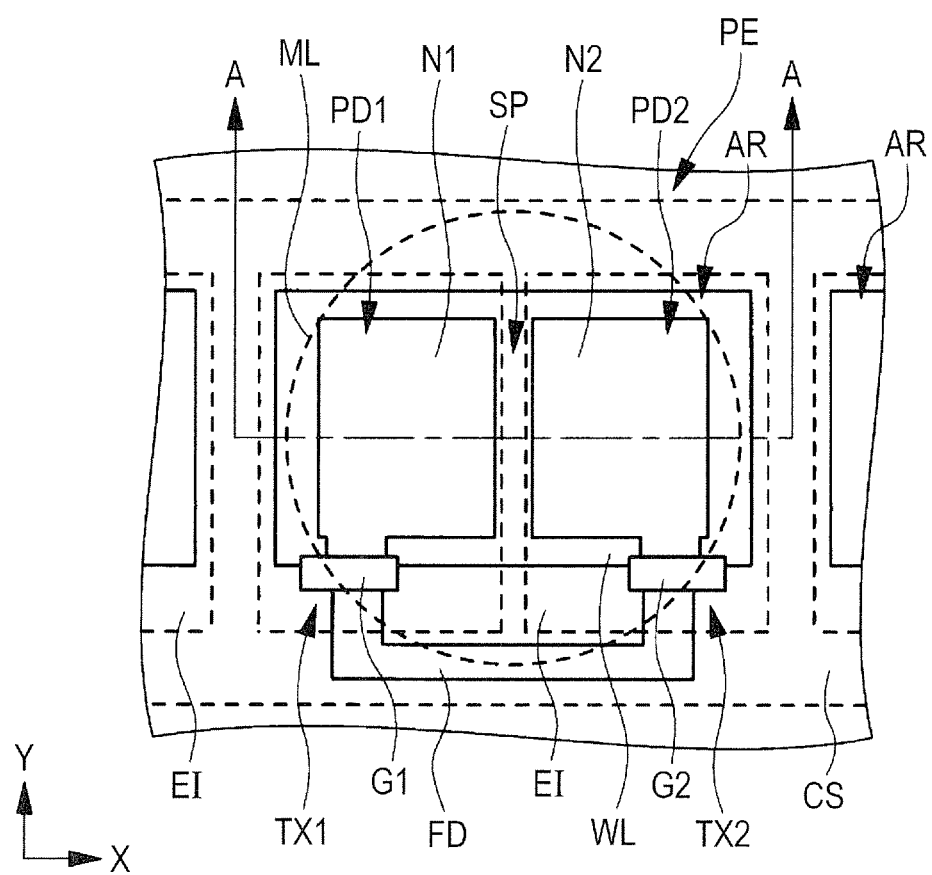
FIG. 27 is a plan view showing a semiconductor device of Second Embodiment of the present invention.

In the present Second Embodiment, the isolation region between the photodiodes is formed by ion implantation performed in the formation step of a pixel isolation region. Below, the plan view of the semiconductor device of the present embodiment is shown in FIG. 27. FIG. 27 shows the completed pixel PE. However, for ease of understanding of the drawing, wires, vias, interlayer insulation films, and the like are not shown.

The pixel PE of the present embodiment shown in FIG. 27 is different from the structure described by reference to FIG. 2 in that the pixel isolation region CS and the isolation region SP are formed by the same step, and are integrated with each other. Other structures are the same as those in the First Embodiment.

Figure 28:
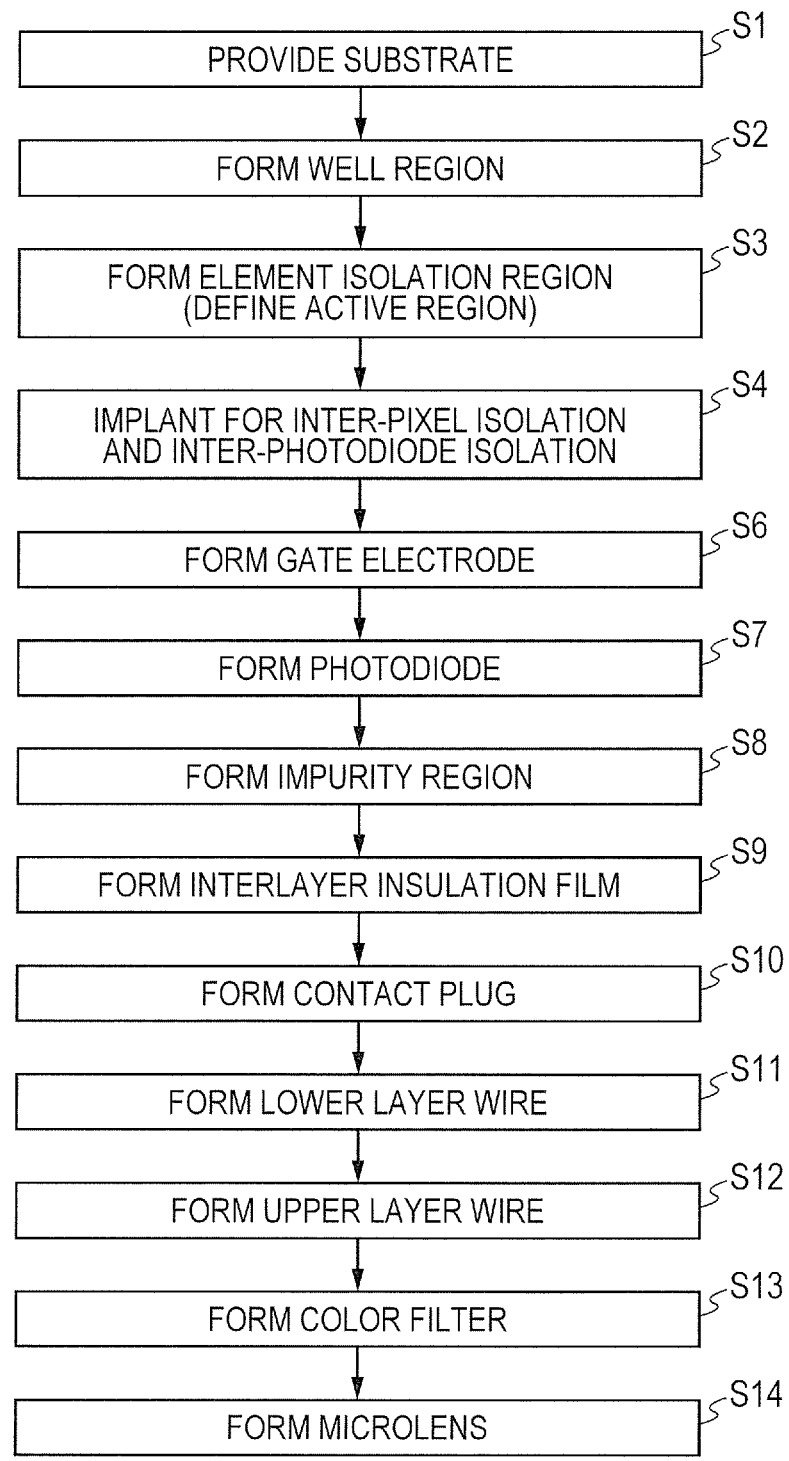
FIG. 28 is a view showing the flow of the manufacturing steps of the semiconductor device of Second Embodiment of the present invention.

Then, FIG. 28 shows the flow of the manufacturing steps of the semiconductor device of the present embodiment. As shown in FIG. 28, as distinct from the First Embodiment described by reference to FIG. 8, herein, a single inter-photodiode isolating implantation step (Step S5 of FIG. 8) is not performed. The present embodiment is characterized in that simultaneously with performing the ion implantation step of forming the pixel isolation region CS shown in FIG. 27, the isolation region SP is formed (Step S4 of FIG. 28). This eliminates the necessity of performing separate ion implantation from the formation step of the pixel isolation region CS for forming the isolation region SP. As a result, it is possible to reduce the manufacturing cost of the semiconductor device.

As described previously, the isolation region SP and the pixel isolation region CS are both formed by multi-stage implantation. Accordingly, the semiconductor regions can be both formed together by the same step. Herein, for example, when the pixel isolation region CS is formed by multi-stage implantation of 7 times, and the isolation region SP is formed by multi-stage implantation of 3 times, the resist pattern for use as a mask may be properly changed between in the implantation step performed for forming only the pixel isolation region CS, and in the implantation step performed for forming the pixel isolation region CS and the isolation region SP of the ion implantation steps performed plural times in the multi-stage implantation step. Therefore, it can be considered that the resist pattern is formed again one time or plural times in the multi-stage implantation step.

Incidentally, when the isolation region SP is formed not by multi-stage implantation but by one-time implantation, ion implantation for forming the isolation region SP and the pixel isolation region CS is performed in any one-time implantation step of the multi-stage implantation step performed for forming the pixel isolation region CS.

The manufacturing steps of the semiconductor device of the present embodiment are performed in the same manner as the manufacturing steps of the semiconductor device of the First Embodiment, except that the formation step of the isolation region SP is not performed alone, and that the isolation region SP and the pixel isolation region CS are formed by the same step.

In the present embodiment, it is possible to obtain the same effects as those of the First Embodiment. Further, the formation of the isolation region SP does not require performing of separate ion implantation from the formation step of the pixel isolation region CS. For this reason, it is possible to reduce the manufacturing cost of the semiconductor device.

Regarding Modified Example

Figure 29:
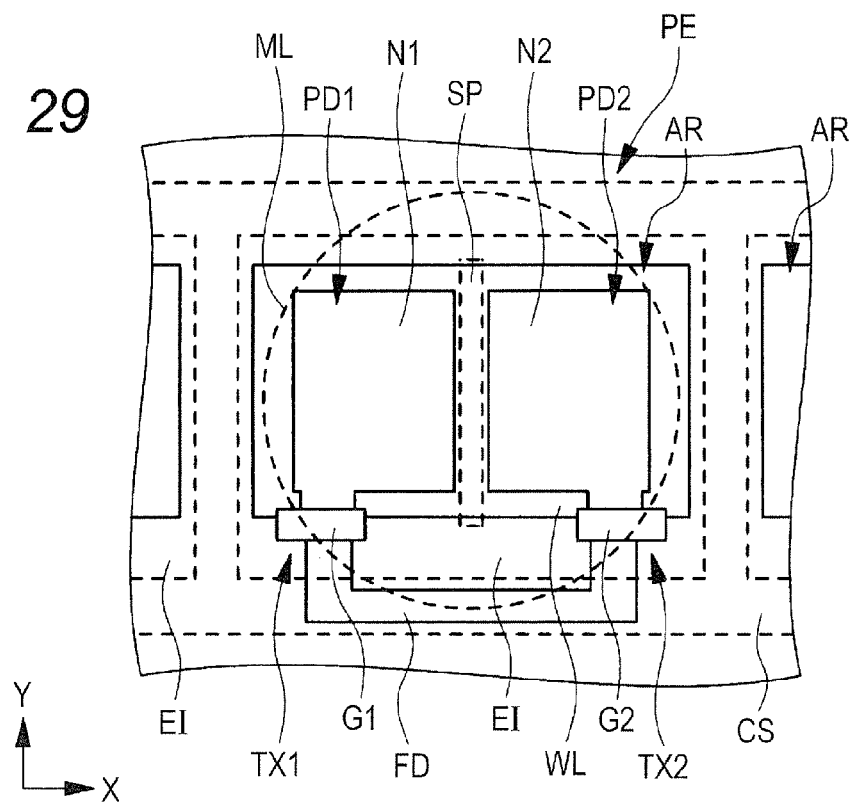
FIG. 29 is a plan view showing a semiconductor device of Modified Example of Second Embodiment of the present invention.

Below, a semiconductor device of Modified Example of the present embodiment, and a manufacturing method thereof will be described by reference to FIG. 29. FIG. 29 is a plan view showing one pixel included in the semiconductor device of Modified Example of the present embodiment on an enlarged scale. The semiconductor device of the present Modified Example is the same as the structure described by reference to FIG. 27 in that the isolation region SP is formed by the same step as that for the pixel isolation region CS. However, as distinct from the structure shown in FIG. 27, in the present Modified Example, as shown in FIG. 29, the pixel isolation region CS and the isolation region SP are spaced apart from each other.

The isolation region SP extends from one end across to the other end of the active region AR in a plan view. Herein, in a plan view, a part of the isolation region SP overlaps the element isolation region EI, but the isolation region SP and the pixel isolation region CS do not overlap each other. Namely, the isolation region SP and the pixel isolation region CS are spaced apart from each other immediately under the element isolation region EI.

The manufacturing steps of the semiconductor device of the present Modified Example are the same as the steps described by reference to FIGS. 27 and 28. In other words, the isolation region SP is formed by the same ion implantation step as that for the pixel isolation region CS. However, in the ion implantation step, the isolation region SP and the pixel isolation region CS are formed immediately under different openings of the plurality of openings formed in the resist pattern for use as a mask, respectively.

The spacing between the isolation region SP and the pixel isolation region CS is the minimum dimension which can be formed with stability, for example, when the resist pattern is used. In order to prevent the degradation of the electron isolating characteristic by the isolation region SP, the end of the isolation region SP desirably reaches at least the end of the element isolation region EI in a plan view.

Figure 35:
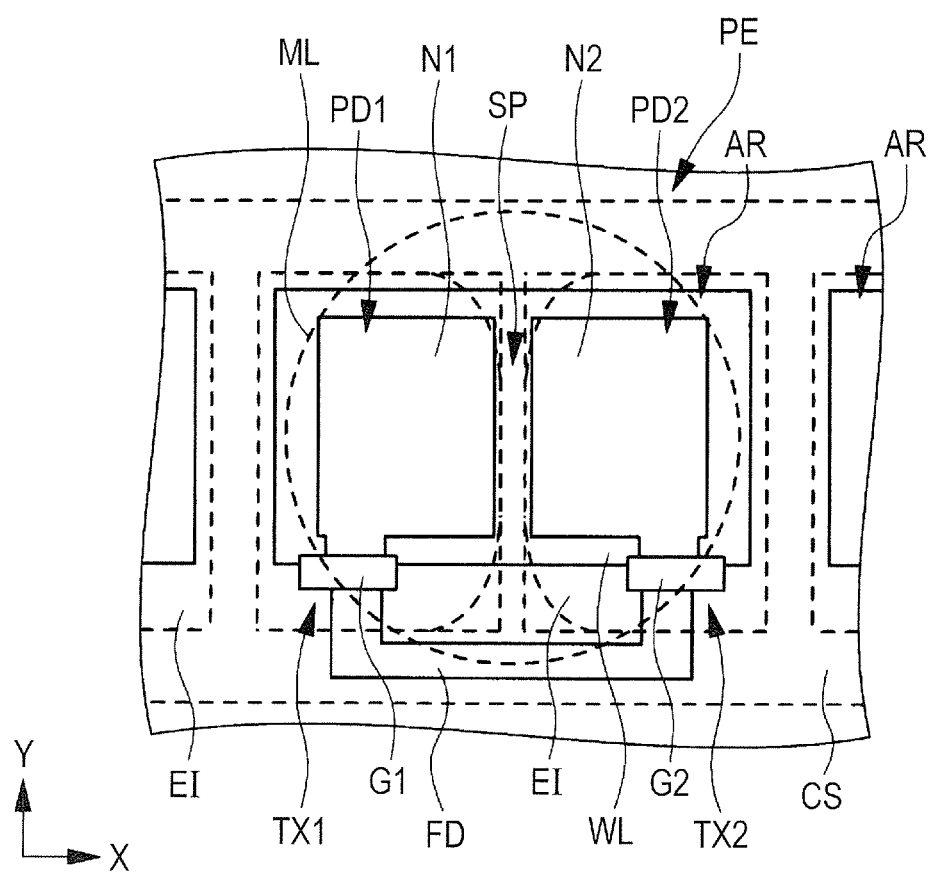
FIG. 35 is a plan view showing a semiconductor device of Comparative Example.

Below, the effects of the present Modified Example will be described as Comparative Example by reference to FIG. 35. FIG. 35 is a plan view showing the pixel of the semiconductor device of Comparative Example. In the Comparative Example, the isolation region SP and the pixel isolation region CS are formed by the same step, and the isolation region SP and the pixel isolation region CS are formed as an integral pattern in the semiconductor substrate.

In Comparative Example, as shown in FIG. 35, the isolation region SP and the pixel isolation region CS are formed by the same ion implantation step so that the end of the isolation region SP extending in the Y axis direction and the sidewall of the pixel isolation region CS extending in the X axis direction are in contact with each other. At this step, due to the variation in the resist pattern for use as the mask for ion implantation, each P type impurity forming the isolation region SP and the pixel isolation region CS is diffused into the vicinity of the coupling part between the isolation region SP and the pixel isolation region CS. In FIG. 35, the outline of the P type semiconductor region expanded by the diffusion is indicated with a broken line. The P type semiconductor region is formed of the P type impurity diffused in such a manner as to couple one side of the pixel isolation region CS and the side in the longitudinal direction of the isolation region SP in a plan view.

Thus, when the isolation region SP and the pixel isolation region CS are formed by the same ion implantation step, it is difficult to form the coupling part between the isolation region SP and the pixel isolation region CS in right angles in a plan view with precision even if ions are implanted through the same opening formed in the resist pattern, thereby to form the pattern of semiconductor region obtained by integrating the isolation region SP and the pixel isolation region CS. Particularly, B (boron) has a property of tending to be diffused, and hence the diffusion tends to occur.

Accordingly, the diffusion of the P type impurity expands the P type semiconductor region in the vicinity of the coupling part between the isolation region SP and the pixel isolation region CS. Then, each N type impurity density of the N⁻ type semiconductor regions N1 and N2 is reduced, resulting in a reduction of the number of electrons generated in the photodiodes PD1 and PD2, and the number of electrons to be accumulated therein (the saturation electron number). This unfavorably results in a reduction of the sensitivity of the pixel.

Thus, in the present Modified Example, the isolation region SP and the pixel isolation region CS formed by the same step are formed apart from each other. This prevents the diffusion of the P type impurity in the isolation region SP and in the pixel isolation region CS. As a result, the saturation electron number of the pixel can be prevented from being reduced, which can prevent the reduction of the sensitivity of the pixel. In other words, the performances of the semiconductor device can be improved.

Third Embodiment

Figure 30:
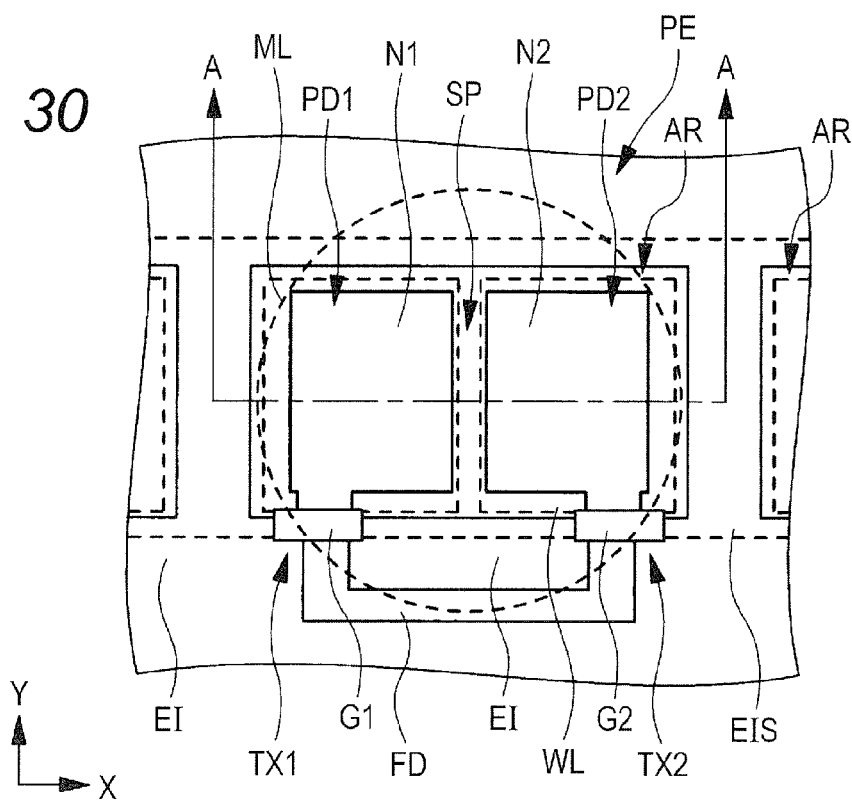
FIG. 30 is a plan view showing a semiconductor device of Third Embodiment of the present invention.
Figure 31:
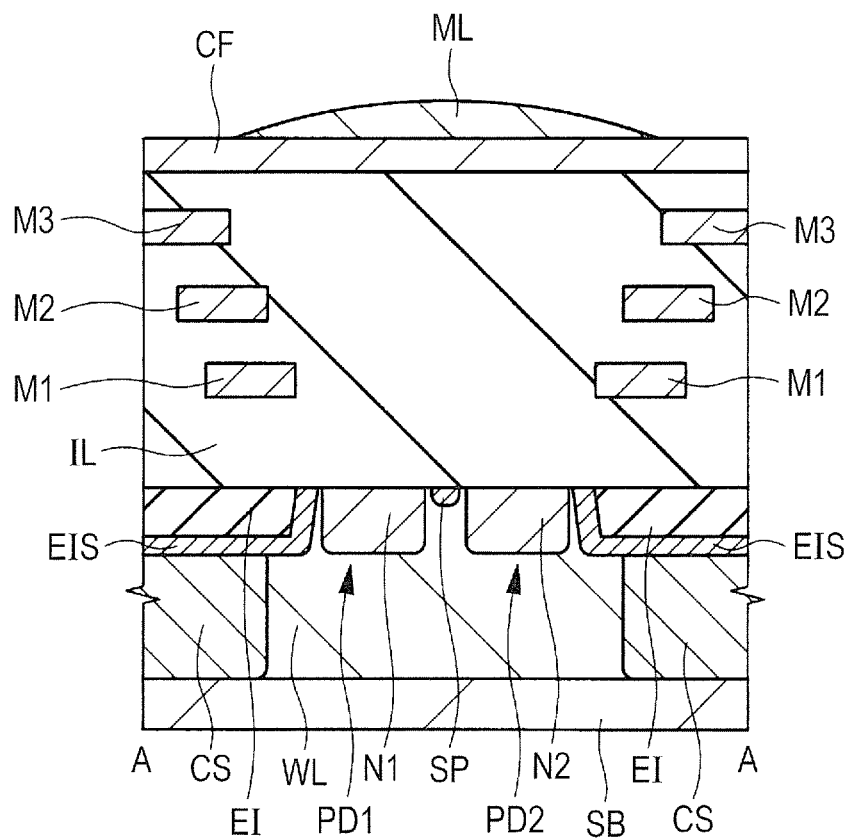
FIG. 31 is a cross sectional view showing the semiconductor device of Third Embodiment of the present invention.
Figure 32:
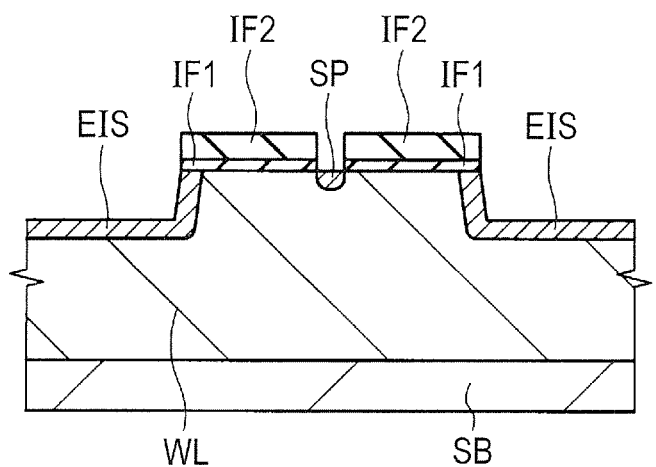
FIG. 32 is a cross sectional view showing the semiconductor device of Third Embodiment of the present invention during a manufacturing step.

In the present Third Embodiment, the isolation region is formed by the same step as the formation step of the semiconductor region formed as a channel stopper region or an r region around the photodiodes in the vicinity of the surface of the semiconductor substrate adjacent to the element isolation region. This will be described by reference to FIGS. 30 to 32. FIG. 30 is a plan view showing one pixel included in the solid-state image sensing element of the semiconductor device of the present embodiment on an enlarged view. FIG. 31 is a cross sectional view along line A-A of FIG. 30. FIG. 32 is a cross sectional view showing a formation step of the semiconductor device of the present embodiment. In FIG. 30, for ease of understanding of the drawing, the pixel isolation region CS (see FIG. 2) described in the First and Second Embodiments is not shown.

As shown in FIGS. 30 and 31, the structure of the semiconductor device of the present embodiment is almost the same as that of the First Embodiment. However, herein, as distinct from the First Embodiment, a P type semiconductor region EIS is formed in the semiconductor substrate SB in the vicinity of the element isolation region EI. Further, herein, as distinct from the First Embodiment, the isolation region SP is integrated with the semiconductor region EIS.

Further, as shown in FIG. 31, the isolation region SP is formed in the semiconductor substrate SB between the N⁻ type semiconductor region N1 and the N⁻ type semiconductor region N2 adjacent to each other. In other words, the region including the isolation region SP formed therein is not only the deeper region than each bottom surface of the N⁻ type semiconductor regions N1 and N2. The isolation region SP is a part including the main surface of the semiconductor substrate SB, and is formed at a shallower position than in the First Embodiment.

The semiconductor region EIS is used as a channel stopper provided for preventing the formation of a channel in the vicinity of the interface between the element isolation region EI and the semiconductor substrate SB, or is used as a guard ring region for canceling and removing the dark electrons generated due to the defect or the stress caused in the vicinity of the interface between the element isolation region EI and the semiconductor substrate SB.

A channel may be formed immediately under the element isolation region EI by the gate wire provided over the element isolation region EI, or the like. In this case, even when the active regions are attempted to be isolated by the element isolation region EI, a minute leakage current is generated between the active regions. In order to inhibit the generation of the channel causing such a leakage current, the semiconductor region EIS is formed as the channel stopper as described above.

Further, the dark electrons are the electrons generated in the light receiving part even in the state in which the pixel is not irradiated with a light. When the electrons are captured into the photodiode, in the image obtainable by the solid-state image sensing element, the part which originally blackens unfavorably brightens. In other words, the dark time characteristic of the solid-state image sensing element is deteriorated.

In order to suppress the occurrence of the problem caused in the vicinity of the interface between the element isolation region EI and the semiconductor substrate SB, the semiconductor region EIS is formed in the region including the surface of the semiconductor substrate SB in contact with the element isolation region EI, and in a relatively shallower region in the vicinity of the main surface of the semiconductor substrate SB. The isolation region SP of the present embodiment is formed by the ion implantation step which is the formation step of the semiconductor region EIS, and hence, is formed in the region including the surface of the semiconductor substrate SB, and in a relatively shallower region in the vicinity of the main surface of the semiconductor substrate SB as with the semiconductor region EIS.

As shown in FIG. 31, the semiconductor region EIS is formed along the interface between the element isolation region EI and the semiconductor substrate SB in the surface of the semiconductor substrate SB. The semiconductor region EIS is also formed in the main surface of the semiconductor substrate SB exposed from the element isolation region EI, and adjacent to the element isolation region EI. In other words, the semiconductor region EIS is formed in the semiconductor substrate SB in such a manner as to cover the sidewall and the bottom surface of the element isolation region EI.

In the manufacturing steps of the semiconductor device of the present embodiment, as distinct from the steps described by reference to FIG. 8 in the First Embodiment, the isolation region SP is not formed alone, and the implantation step for forming the isolation region SP and the semiconductor region EIS together is performed. In other words, the Step S5 shown in FIG. 8 is not performed. When the semiconductor region EIS is formed as a channel stopper region, the surface of the semiconductor substrate SB is subjected to ion implantation during the formation of the element isolation region EI, thereby to form the semiconductor region EIS and the isolation region SP. In other words, the semiconductor region EIS and the isolation region SP are formed in the Step S3 of FIG. 8.

Alternatively, when the semiconductor region EIS is formed as a guard ring region, the semiconductor substrate SB is subjected to ion implantation at any time point after the formation step of the element isolation region EI (Step S3 of FIG. 8), and before the formation step of the impurity region (Step S8 of FIG. 8), thereby to form the semiconductor region EIS and the isolation region SP. In this case, the semiconductor region EIS of a guard ring region, and the isolation region SP are formed by multi-stage implantation. As a result, a P type impurity is implanted into a plurality of parts aligned along the sidewall and the bottom surface of the element isolation region EI in the semiconductor substrate SB, thereby to form the semiconductor region EIS. At this step, by multi-stage implantation, the isolation region SP can also be formed from the main surface of the semiconductor substrate SB across to a relatively deeper position.

Then, by reference to FIG. 32, a description will be given to the step of forming the semiconductor region EIS of the channel stopper region, and the isolation region SP during the formation of the element isolation region EI in the Step S3 of FIG. 8. Herein, a description will be given to the method for forming the element isolation region EI by a STI method.

Herein, first, by the step described by reference to FIG. 9, a semiconductor substrate SB is provided, and a well region WL is formed. Then, as shown in FIG. 32, an insulation film IF1 is formed over the semiconductor substrate SB using, for example, an oxidation method. Then, an insulation film IF2 is formed over the insulation film IF1 by, for example, a CVD method. The insulation film IF1 is formed of, for example, a silicon oxide film. The insulation film IF2 is formed of, for example, a silicon nitride film.

Then, using a photolithography technique and an etching method, the insulation films IF1 and IF2 are partially removed. As a result, the upper surface of the semiconductor substrate SB serving as an inactive region is exposed. Subsequently, using the insulation film IF2 as a mask, dry etching is performed, thereby to form a trench for forming an element isolation region in the main surface of the semiconductor substrate SB. Then, using a photolithography technique and an etching method, an opening extending in the Y axis direction at the central part of the active region AR (see FIG. 30) in a plan view is formed in a lamination film formed of the insulation films IF1 and IF2. As a result, a part of the main surface of the semiconductor substrate SB in the active region AR is exposed.

Then, a P type impurity (e.g., B (boron)) is implanted into the surface of the semiconductor substrate SB exposed from the lamination film by an ion implantation method. As a result, a semiconductor region EIS is formed at the surface of the trench for forming an element isolation region, and an isolation region SP is formed in the main surface of the semiconductor substrate SB in the active region AR. As shown in FIG. 30, herein, the isolation region SP and the semiconductor region EIS are integrated with each other.

Then, by, for example, a CVD method, a silicon oxide film for filling the trench is formed. Subsequently, excess portions of the silicon oxide film over the main surface of the semiconductor substrate SB are removed by, for example, a CMP method. Then, the lamination film formed of the insulation films IF1 and IF2 is removed, thereby to form the element isolation region EI formed of the silicon oxide film embedded in the trench. As a result, the Step S3 of FIG. 8 is completed.

Up to this point, a description has been given to the case where the element isolation region EI is formed by a STI method. However, also when the element isolation region EI is formed by a LOCOS method, ion implantation for forming the semiconductor region EIS and the isolation region SP can also be performed during the formation step of the element isolation region EI. For example, when after forming a trench in the main surface of the semiconductor substrate SB, the element isolation region EI, i.e., a recess LOCOS is formed in the trench by a LOCOS method, after the formation of the trench, the ion implantation is subsequently performed. As a result, the semiconductor region EIS and the isolation region SP can be formed. Then, an oxidation step is performed. As a result, a recess LOCOS can be formed in the trench.

Alternatively, even in the case using a LOCOS method in which a trench is not formed, after the formation of a mask pattern of a silicon nitride film covering the part of the upper surface of the semiconductor substrate SB serving as an active region, ion implantation is performed. As a result, the semiconductor region EIS and the isolation region SP can be formed. Then, an oxidation treatment is performed. As a result, the element isolation region EI can be formed at a part exposed from the mask pattern.

In the present embodiment, the P type isolation region SP is formed between the N$^-$ type semiconductor regions N1 and N2 adjacent to each other in the pixel PE shown in FIGS. 30 and 31. This can prevent the photoelectrically converted electrons from moving between the photodiodes PD1 and PD2. The isolation region SP herein formed is shallower in formation depth than that of the First Embodiment. However, B (boron) in the isolation region SP is also diffused in the depth direction of the semiconductor substrate SB. For this reason, it is possible to obtain the effect of preventing the movement of the photoelectrically converted electrons between the photodiodes PD1 and PD2 in a deeper region than the N$^-$ type semiconductor region N1 and the N$^-$ type semiconductor region N2.

This can improve the isolation characteristic of the photoelectrically converted electrons generated in the vicinity of the region between the N$^-$ type semiconductor region N1 and the N$^-$ type semiconductor region N2. Accordingly, it is possible to improve the detection precision of the focusing state in the imaging surface phase difference autofocusing operation. For this reason, it is possible to improve the performances of the semiconductor device.

Further, the isolation region SP can be formed using the formation step of the channel stopper region or the guard ring region. This eliminates the necessity of adding anion implantation step for forming the isolation region SP. Therefore, the manufacturing cost of the semiconductor device can be reduced.

Incidentally, herein, the isolation region SP is formed at the same height as that of the N$^-$ type semiconductor regions N1 and N2. Accordingly, in order to prevent the reduction of the saturation electron number of the photodiodes PD1 and PD2 due to diffusion of the P type impurity in the isolation region SP, the isolation region SP and the N$^-$ type semiconductor regions N1 and N2 are desirably spaced apart from each other as much as possible by the reduction of the width of the isolation region SP, or the like.

Alternatively, as with the Modified Example of Second Embodiment, the semiconductor region EIS and the isolation region SP may be formed apart from each other. As a result, as with the Second Embodiment, it is possible to prevent the diffusion of the P type impurity doped into the semiconductor region EIS and the isolation region SP.

Up to this point, the invention completed by the present inventors was specifically described by way of embodiments. However, it is naturally understood that the present invention is not limited to the embodiments, and may be variously changed within the scope not departing from the gist.

For example, as the impurity ion to be ion-implanted into the semiconductor substrate for forming the P type semiconductor layer, B (boron) was shown. However, other than this, $BF_2$ can also be implanted.

Further, in the embodiments, a description has been given to the case where each pixel has an active region surrounded by the element isolation regions. However, one line of a plurality of pixels in an array may respectively have one active region extending in a band in a plan view in common.

In that case, it can be considered that the pixel isolation region formed from the main surface of the semiconductor substrate across to the bottom of the well region is provided between respective pixels for inter-pixel isolation.

What is claimed is:

1. A semiconductor device having a solid-state image sensing element including a pixel including a first photodiode and a second photodiode, the semiconductor device comprising:

a semiconductor substrate;

a well region having a first conductivity type formed at an upper surface of an active region of the semiconductor substrate;

a first semiconductor region and a second semiconductor region formed apart from each other at an upper surface of the well region in the active region; and a third semiconductor region having the first conductivity type situated between the first semiconductor region and the second semiconductor region in a plan view, wherein the third semiconductor region is formed in the well region below the first semiconductor region and the second semiconductor region such that, in a cross-sectional view, the third semiconductor region terminates at an upper end disposed at least as deep as the first semiconductor region and the second semiconductor region, wherein the first semiconductor region and the second semiconductor region each have a second conductivity type different from the first conductivity type, wherein the first semiconductor region forms a charge accumulating region in the first photodiode, and the second semiconductor region forms a charge accumulating region in the second photodiode, and wherein the third semiconductor region is higher in impurity density than the well region.

2. The semiconductor device according to claim 1, wherein a density distribution of an impurity of the first conductivity type of the third semiconductor region in a depth direction perpendicular to the upper surface of the semiconductor substrate has a plurality of density peaks.

3. The semiconductor device according to claim 2, wherein a density peak closest to the upper surface of the semiconductor substrate is higher in impurity density than other density peaks.

4. The semiconductor device according to claim 3, wherein the pixel is used for detecting a green or blue light.

5. The semiconductor device according to claim 2, wherein a density peak closest to the upper surface of the semiconductor substrate is lower in impurity density than other density peaks.

6. The semiconductor device according to claim 5, wherein the pixel is used for detecting a red light.

7. The semiconductor device according to claim 1, comprising:

an element isolation region formed in contact with the upper surface of the semiconductor substrate, and surrounding the active region in a plan view; and a fourth semiconductor region having the first conductivity type formed in the semiconductor substrate immediately under the element isolation region, extending from a lower surface of the element isolation region to a bottom surface of the well region, and provided between adjacent pixels, wherein the fourth semiconductor region is higher in impurity density than the well region, and wherein the third semiconductor region and the fourth semiconductor region are in contact with each other.

8. The semiconductor device according to claim 1, comprising:
an element isolation region formed in contact with the upper surface of the semiconductor substrate, and surrounding the active region in a plan view; and
a fourth semiconductor region having the first conductivity type formed in the semiconductor substrate immediately under the element isolation region provided between adjacent pixels,
wherein the fourth semiconductor region is higher in impurity density than the well region, and
wherein the third semiconductor region and the fourth semiconductor region are spaced apart from each other.

9. A semiconductor device having a solid-state image sensing element including a pixel including a first photodiode and a second photodiode,
the semiconductor device comprising:
a semiconductor substrate;
a well region having a first conductivity type formed at an upper surface of an active region of the semiconductor substrate;
a first semiconductor region and a second semiconductor region formed apart from each other at an upper surface of the well region in the active region;
a third semiconductor region having the first conductivity type situated between the first semiconductor region and the second semiconductor region in a cross-section view, the third semiconductor region terminating at a lower end disposed no deeper than a depth of the first semiconductor region and the second semiconductor region;
an element isolation region formed in contact with the upper surface of the semiconductor substrate, and surrounding the active region in a plan view; and
a fourth semiconductor region having the first conductivity type formed at a surface of the semiconductor substrate in contact with the element isolation region,
wherein the first semiconductor region and the second semiconductor region each have a second conductivity type different from the first conductivity type,
wherein the first semiconductor region forms the first photodiode, and the second semiconductor region forms the second photodiode, and
wherein the third semiconductor region and the fourth semiconductor region are higher in impurity density than the well region.

10. A method for manufacturing a semiconductor device having a solid-state image sensing element including a pixel including a first photodiode and a second photodiode,
the method comprising the steps of:
(a) providing a semiconductor substrate having a first region at an upper surface, and a second region surrounding the first region in a plan view;
(b) forming a well region having a first conductivity type at the upper surface of the semiconductor substrate;
(c) forming an element isolation region in contact with the upper surface of the semiconductor substrate in the second region;
(d) after the step (b), forming a third semiconductor region having the first conductivity type, and extending in a longitudinal direction along the upper surface of the semiconductor substrate in the semiconductor substrate in the first region; and
(e) after the step (c) and the step (d), forming a first semiconductor region and a second semiconductor region at an upper surface of the well region in the first region such that, in a plan view, the third semiconductor region is interposed between the first semiconductor region and the second semiconductor region in a transverse direction of the third semiconductor region,
wherein the first semiconductor region and the second semiconductor region each have a second conductivity type different from the first conductivity type,
wherein the first semiconductor region forms a charge accumulating region in the first photodiode, and the second semiconductor region forms a charge accumulating region in the second photodiode,
wherein the third semiconductor region is higher in impurity density than the well region, and
wherein, in a cross-sectional view, the third semiconductor region is configured to terminate at an upper end disposed at least as deep as the first semiconductor region and the second semiconductor region, or to terminate at a lower end disposed no deeper than a depth of the first semiconductor region and the second semiconductor region.

11. The method for manufacturing a semiconductor device according to claim 10,
wherein, in the cross-sectional view, the third semiconductor region is configured to terminate at an upper end disposed at least as deep as the first semiconductor region and the second semiconductor region.

12. The method for manufacturing a semiconductor device according to claim 10,
wherein in the step (d), an impurity of the first conductivity type is implanted into the semiconductor substrate a plurality of times, thereby to form the third semiconductor region.

13. The method for manufacturing a semiconductor device according to claim 12,
wherein a density distribution of the impurity of the first conductivity type in the third semiconductor region in a depth direction perpendicular to the upper surface of the semiconductor substrate has density peaks, and
wherein a density peak closest to the upper surface of the semiconductor substrate is higher in impurity density than other density peaks.

14. The method for manufacturing a semiconductor device according to claim 12,
wherein a density distribution of the impurity of the first conductivity type in the third semiconductor region in a depth direction perpendicular to the upper surface of the semiconductor substrate has density peaks, and
wherein a density peak closest to the upper surface of the semiconductor substrate is lower in impurity density than other density peaks.

15. The method for manufacturing a semiconductor device according to claim 10,
wherein in the step (d), the first region and the second region are doped with an impurity of the first conductivity type, thereby to form the third semiconductor region in the semiconductor substrate in the first region, and to form a fourth semiconductor region in the semiconductor substrate in the second region.

16. The method for manufacturing a semiconductor device according to claim 15,
wherein the third semiconductor region and the fourth semiconductor region are spaced apart from each other in the plan view.

17. The method for manufacturing a semiconductor device according to claim 15, wherein the third semiconductor region is formed at the upper surface of the semiconductor substrate, and wherein the fourth semiconductor region is formed at a surface of the semiconductor substrate in contact with the element isolation region.

* * * * *